US012701845B2

(12) United States Patent
Kim et al.

(10) Patent No.: US 12,701,845 B2
(45) Date of Patent: Aug. 4, 2026

(54) DISPLAY DEVICE

(71) Applicant: Samsung Display Co., LTD., Yongin-si (KR)

(72) Inventors: In Woo Kim, Yongin-si (KR); Yong Tae Cho, Yongin-si (KR); Kook Hyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 767 days.

(21) Appl. No.: 17/969,085

(22) Filed: Oct. 19, 2022

(65) Prior Publication Data

US 2023/0317762 A1 Oct. 5, 2023

(30) Foreign Application Priority Data

Mar. 29, 2022 (KR) ........................ 10-2022-0039193

(51) Int. Cl.
*H10H 20/84* (2025.01)
*H10H 20/821* (2025.01)
*H10H 29/14* (2025.01)

(52) U.S. Cl.
CPC ........ *H10H 29/142* (2025.01); *H10H 20/821* (2025.01); *H10H 20/84* (2025.01)

(58) Field of Classification Search
CPC .... B32B 2457/202; H05K 2201/10136; G09G 2380/02; G09G 2300/0426; H10K 77/10–111; H10K 2102/311; H10K 50/11; H10K 50/15; H10K 50/16; H10K 50/171; H10K 2101/30; H10K 2101/40; H10K 2102/351; H10K 50/852; H10K 59/35;

H10K 59/12; H10K 50/156; H10K 2101/00; H10K 50/844; H10K 59/131; H10K 50/805; H10K 50/856; H10K 50/8445; H10K 50/85; H10K 59/10; H10K 59/129;

(Continued)

(56) References Cited

U.S. PATENT DOCUMENTS 6,774,969 B2 8/2004 Ma et al.
8,064,027 B2 11/2011 Choi et al.
(Continued)

FOREIGN PATENT DOCUMENTS

KR 10-2008-0027582 3/2008
KR 10-0839149 6/2008
(Continued)

*Primary Examiner* — Moin M Rahman
(74) *Attorney, Agent, or Firm* — Womble Bond Dickinson (US) LLP

(57) ABSTRACT

A display device includes a display area and a pad area. The display device may include a pixel on a base layer in the display area, the pixel including a light emitting element, and pads on the base layer in the pad area. The pads may include pad lines including first and second pad lines and first and second electrode parts. The pads may include a first contact area and a second contact area. The first pad line and the second pad line may be electrically connected to each other in the first contact area. The second pad line and the second electrode part may be electrically connected in the second contact area. The first electrode part may overlap the second pad line in a plan view. The first and second electrode parts may be electrically separated from each other by a pad insulating pattern.

19 Claims, 17 Drawing Sheets

(58) Field of Classification Search

CPC ............. H10K 2102/361; H10K 71/00; H10K
85/615; H10K 85/624; H10K 85/626;
H10K 85/631; H10K 85/633; H10K
85/636; H10K 85/6572; H10K 50/155;
H10K 50/115; H10K 50/13; H10K 50/80;
H10K 85/6574; H10K 59/873; B60K
37/02; B60K 2370/1523; B60K 2370/331;
B60K 2370/52; B60R 1/00; G02F
1/133305; G02F 1/133388; G02F
1/13452; G02F 1/136254; G02F 2201/50;
G02F 2202/28; H01L 2224/73204; Y02E
10/549

See application file for complete search history.

(56)                      References Cited

U.S. PATENT DOCUMENTS

| | | | |
|---|---|---|---|
| 2020/0403029 A1* | 12/2020 | Kim .................... | H10H 29/142 |
| 2021/0134877 A1 | 5/2021 | Kim et al. | |
| 2021/0313498 A1* | 10/2021 | Kim ................... | H01L 25/0753 |

FOREIGN PATENT DOCUMENTS

| | | |
|---|---|---|
| KR | 10-2020-0076938 | 6/2020 |
| KR | 10-2021-0054117 | 5/2021 |

* cited by examiner

DCB: COF, FPCB

PAD: PAD1, PAD2
PXL: SPXL1, SPXL2, SPXL3

ELT: ELT1, ELT2
INP: INP1, INP2
BNK: BNK1, BNK2
SDL: TE1, TE2, PL

CCL: CCL1, CCL2, LSL
CFL: CF1, CF2, CF3

ELT: ELT1, ELT2
INP: INP1, INP2
BNK: BNK1, BNK2

PAD: 120, 140, 160, 182, 184
COF: COF1, COF2

FIG. 11

190(INS3)
INS1
124(SDL)
ILD2
ILD1
BFL
122(BML)
BSL

182

140

SA

160

184

SA

182

140

II

II'

DR3

PAD: 120, 140, 160, 182, 184
120: 122, 124

FIG. 12

PAD: 120, 140, 160, 182, 184
COF: COF1, COF2

FIG. 13

PAD: 120, 140, 160, 182, 184
120: 122, 124

R1(RPAD1)

SM

R2(RPAD2)

PAD: 120, 140, 160, 180

INS3
INS1
124(SDL)
ILD2
ILD1
BFL
122(BML)
BSL

180

140

160

140

IV

IV'

PAD: 120, 140, 160, 180
120: 122, 124

R1(RPAD1)

SM

R2(RPAD2)

PAD: 120, 140, 160, 180a, 180b

C1   C2

V   V'

120
140
160
180b
180a

DR1
DR2
DR3

PAD: 120, 140, 160, 180a, 180b
120: 122, 124

DISPLAY DEVICE

CROSS-REFERENCE TO RELATED APPLICATION(S)

The application claims priority to and benefits of Korean patent application No. 10-2022-0039193 under 35 U.S.C. § 119(a), filed on Mar. 29, 2022 in the Korean Intellectual Property Office, the entire contents of which are incorporated herein by reference.

BACKGROUND

1. Technical Field

The disclosure relates to a display device.

2. Related Art

Recently, as interest in information displays increases, research and development of display devices has been continuously conducted.

SUMMARY

Embodiments provide a display device in which a short-circuit defect in a pad area can be substantially prevented, and damage with respect to a line (or electrode) can be substantially prevented.

In accordance with an aspect of the disclosure, there may be provided a display device including a display area and a pad area. The display device may include a pixel on a base layer in the display area, the pixel including a light emitting element, and pads on the base layer in the pad area, the pads including pad lines including a first pad line and a second pad line, a first electrode part, and a second electrode part. The pads may include a first contact area and a second contact area. The first pad line and the second pad line may be electrically connected to each other in the first contact area. The second pad line and the second electrode part may be electrically connected in the second contact area. The first electrode part may overlap the second pad line in a plan view. The first electrode part and the second electrode part may be electrically separated from each other by a pad insulating pattern.

The first electrode part may cover an insulating layer, the insulating layer being on the second pad line in the first contact area.

In the first contact area, the first pad line, the second pad line, the insulating layer, and the first electrode part may overlap each other in a plan view. In the second contact region, the second pad line and the second electrode part may overlap each other in a plan view.

The first pad line and the second pad line may be in different layers.

The display device may further include a buffer layer on the base layer. The buffer layer may form an opening exposing the first pad line in the first contact area. The second pad line may be electrically connected to the first pad line through the opening in the first contact area.

The display device may further include an insulating layer on the second pad line. The insulating layer may form an opening exposing the second pad line in the second contact area. The second electrode part may be electrically connected to the second pad line through the opening in the second contact area.

The first electrode part may entirely cover the first contact area in a plan view.

The pads may be arranged in a matrix form with respect to a row direction and a column direction. The row direction may correspond to a first direction, and the column direction may correspond to a second direction. The pad line may extend in the second direction, and electrically connect a subset of the pads, which are adjacent to each other in the second direction.

The pads may be electrically connected to the pixel. The display device may further include a driving circuit member including a chip on film and a flexible circuit member. An end of the chip on film may be electrically connected to the pad area, and another end of the chip on film may be electrically connected to the flexible circuit member. At least a portion of the chip on film may be electrically connected to the second electrode part.

The chip on film may include a first chip on film and a second chip on film. The pads may include first row pads on a first row and second row pads on a second row. The first chip on film may be electrically connected to the first row pads, and the second chip on film may be electrically connected to the second row pads.

The first row pads and the second row pads may be separated from each other at a separation distance. The separation distance may be about 500 μm or less.

The first contact area of the first row pads and the first contact area of the second row pads may be adjacent to each other with an area interposed therebetween. The area may be disposed between the first row pads and the second row pads.

The first electrode part and the second electrode part may not overlap each other in a plan view.

The first electrode part and the second electrode part may overlap each other in a plan view.

The first electrode part and the second electrode part may be patterned in different processes.

The display device may include a pixel circuit layer on the base layer, the pixel circuit layer including a lower auxiliary electrode and a transistor, and a display element layer on the pixel circuit layer, the display element layer including the light emitting element, a first contact electrode electrically connected to an end of the light emitting element, a second contact electrode electrically connected to another end of the light emitting element, and an insulating layer between the first contact electrode and the second contact electrode. The transistor may include an active layer, a gate electrode, a first transistor electrode electrically connected to a first contact region of the active layer, and a second transistor electrode electrically connected to a second contact region of the active layer. The first pad line may include the same material as the lower auxiliary electrode, the second pad line may include the same material as the first transistor electrode and the second transistor electrode, and the pad insulating pattern may include the same material as the insulating layer.

The light emitting element may be an organic light emitting diode or a subminiature light emitting element including an inorganic material.

The display device may further include a color conversion layer on the light emitting element, the color conversion layer including a quantum dot that changes a wavelength of light.

In accordance with another aspect of the disclosure, there may be provided a display device including a pad area. The display device may include a pixel on a base layer, and pads on the base layer in the pad area, the pads being electrically connected to the pixel and including pad lines including a first pad line and a second pad line, a connection electrode part, and an isolation electrode part. The pads may include a first contact area and a second contact area. The first pad line and the second pad line may be electrically connected to each other in the first contact area. The second pad line and the connection electrode part may be electrically connected to each other in the second contact area. The isolation electrode part may cover an insulating layer on the second pad line in the first contact area. The isolation electrode part may be electrically separated from the connection electrode part.

The connection electrode part and the isolation electrode part may be patterned in a same process.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 11 is a schematic sectional view taken along line II-II' shown in FIG. 9.

FIG. 12 is a schematic enlarged view of the area EA1 shown in FIG. 4.

FIG. 13 is a schematic sectional view taken along line III-III' shown in FIG. 12.

FIG. 14 is a schematic enlarged view of the area EA1 shown in FIG. 4.

FIG. 15 is a schematic sectional view taken along line IV-IV' shown in FIG. 14.

FIG. 16 is a schematic enlarged view of the area EA1 shown in FIG. 4.

DETAILED DESCRIPTION OF THE EMBODIMENTS

Figure 1:
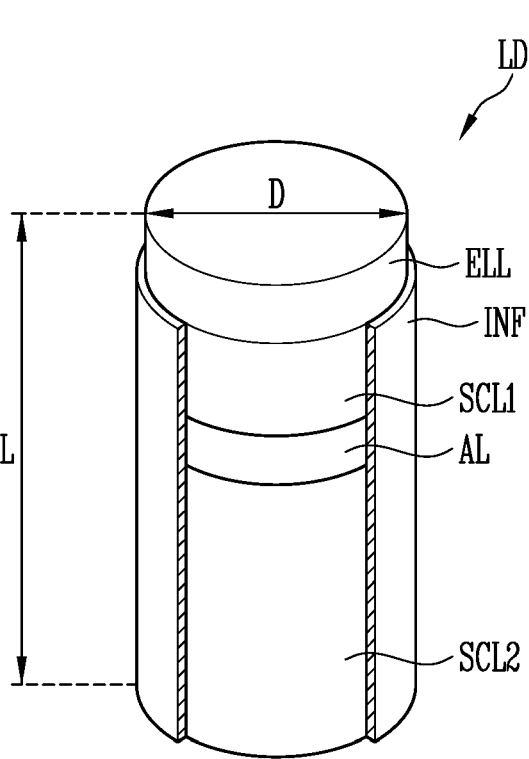
FIG. 1 is a schematic perspective view illustrating a light emitting element in accordance with one or more embodiments of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "comprises," "comprising," "has," "having," "includes," "including," and the like, when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. Similarly, an expression that an element such as a layer, region, substrate or plate is placed "beneath" or "below" another element indicates not only a case where the element is placed "directly beneath" or "just below" the other element but also a case where a further element is interposed between the element and the other element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

First, a light emitting element LD in accordance with one or more embodiments of the disclosure will be described with reference to FIGS. 1 and 2. In accordance with one or more embodiments, the light emitting element LD may emit light. The light emitting element LD may have various types. For example, the light emitting element LD may be a self-luminous element, and may be an Organic Light Emitting Diode (OLED). In other embodiments, the light emitting element LD may be a subminiature light emitting diode including an inorganic material. The type of the light emitting element LD is not necessarily limited to a specific example. Hereinafter, for convenience of description, an embodiment in which the light emitting element LD may be a subminiature light emitting diode including an inorganic material will be described. Subminiature may include nanometer scale to micrometer scale.

Figure 2:
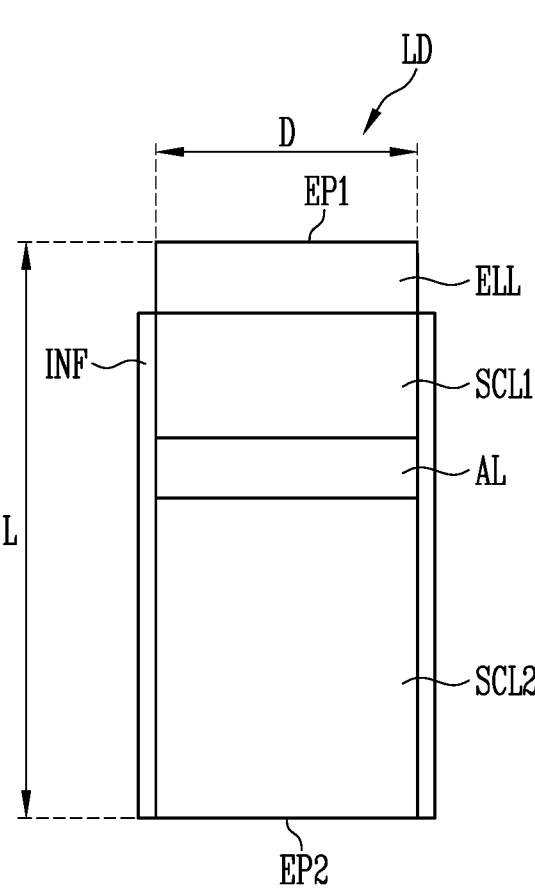
FIG. 2 is a schematic sectional view illustrating the light emitting element of FIG. 1.

FIG. 1 is a schematic perspective view illustrating a light emitting element in accordance with one or more embodiments of the disclosure. FIG. 2 is a schematic sectional view illustrating the light emitting element of FIG. 1.

The light emitting element LD may have various shapes. For example, the light emitting element LD may have a shape extending in a direction. Consistent with some embodiments, a pillar-shaped light emitting element LD is illustrated in FIGS. 1 and 2. However, the kind and shape of the light emitting element LD is not limited to the above-described example.

The light emitting element LD may include a first semiconductor layer SCL1, a second semiconductor layer SCL2, and an active layer AL interposed between the first and second semiconductor layers SCL1 and SCL2. For example, assuming that an extending direction of the light emitting element LD may be a length L direction, the light emitting element LD may include the first semiconductor layer SCL1, the active layer AL, and the second semiconductor layer SCL2, which may be sequentially stacked along the length L direction. The light emitting element LD may further include an electrode layer ELL and an insulative film INF.

The light emitting element LD may be provided in a pillar shape extending along a direction. The light emitting element LD may have a first end portion EP1 and a second end portion EP2. The first semiconductor layer SCL1 may be adjacent to the first end portion EP1, and the second semiconductor layer SCL2 may be adjacent to the second end portion EP2. The electrode layer ELL may be adjacent to the first end portion EP1 of the light emitting element LD.

The light emitting element LD may be a light emitting element manufactured in a pillar shape through an etching process, or the like. The term "pillar shape" may include a rod-like shape or bar-like shape, which may be long in the length L direction (i.e., its aspect ratio may be greater than 1), such as a cylinder or a polyprism, and the shape of its section is not particularly limited. For example, a length L of the light emitting element LD may be greater than a diameter D (or a width of a cross-section) of the light emitting element LD.

The light emitting element LD may have a size of nanometer scale to micrometer scale. For example, the light emitting element LD may have a diameter D (or width) in a range of nanometer scale to micrometer scale and/or a length L in a range of nanometer scale to micrometer scale. However, the size of the light emitting element LD is not limited thereto.

The first semiconductor layer SCL1 may be a first conductivity type semiconductor layer. The first semiconductor layer SCL1 may be disposed on the active layer AL, and may include a semiconductor layer having a type different from a type of the second semiconductor layer SCL2. For example, the first semiconductor layer SCL1 may include a P-type semiconductor layer. In an example, the first semiconductor layer SCL1 may include at least one semiconductor material among InAlGaN, GaN, AlGaN, InGaN, AlN, and InN, and include a P-type semiconductor layer doped with a first conductivity type dopant such as Mg. However, the material constituting the first semiconductor layer SCL1 is not limited thereto. The first semiconductor layer SCL1 may be configured with various materials.

The active layer AL may be disposed between the first semiconductor layer SCL1 and the second semiconductor layer SCL2, and have a single-quantum well structure or a multi-quantum well structure. The position of the active layer AL is not limited to a specific example, and may be variously changed according to the kind of the light emitting element LD.

A clad layer doped with a conductive dopant may be formed on the top and/or the bottom of the active layer AL. For example, the clad layer may be formed as an AlGaN layer or an InAlGaN layer. In some embodiments, a material such as AlGaN or AlInGaN may be used to form the active layer AL. The active layer AL may be configured with various materials.

The second semiconductor layer SCL2 may be a second conductivity type semiconductor layer. The second semiconductor layer SCL2 may be disposed on the active layer AL, and may include a semiconductor layer having a type different from the type of the first semiconductor layer SCL1. For example, the second semiconductor layer SCL2 may include an N-type semiconductor layer. For example, the second semiconductor layer SCL2 may include at least one semiconductor material among InAlGaN, GaN, AlGaN, InGaN, AlN, and InN, and include an N-type semiconductor layer doped with a second conductivity type dopant such as Si, Ge and/or Sn. However, the material constituting the second semiconductor layer SCL2 is not limited thereto. The second semiconductor layer SCL2 may be configured with various materials.

In case that a voltage which is a threshold voltage or more is applied to both ends of the light emitting element LD, the light emitting element LD may emit light as electron-hole pairs are combined in the active layer AL. The light emission of the light emitting element LD may be controlled by using such a principle, so that the light emitting element LD can be used as a light source for various light emitting devices, including a pixel of a display device.

The insulative film INF may be disposed on a surface of the light emitting element LD. The insulative film INF may be formed on the surface of the light emitting element LD to surround an outer circumferential surface of at least the active layer AL. The insulative film INF may surround an area of the first and second semiconductor layers SCL1 and SCL2. The insulative film INF may be formed as a single layer or a multi-layer. However, the disclosure is not limited thereto, and the insulative film INF may be configured with multiple layers. For example, the insulative film INF may include a first insulating layer including a first material and a second insulating layer including a second material different from the first material.

The insulative film INF may expose both the end portions of the light emitting element LD, which have different polarities. For example, the insulative film INF may expose an end of each of the electrode layer ELL and the second semiconductor layer SCL2, which are respectively adjacent to the first and second end portions EP1 and EP2 of the light emitting element LD.

The insulative film INF may include at least one insulating material among silicon oxide ($SiO_x$), silicon nitride ($SiN_x$), silicon oxynitride ($SiO_xN_y$), aluminum oxide ($AlO_x$), and titanium oxide ($TiO_x$). The insulative film INF may have a single-layer structure or a multi-layer structure. However, the disclosure is not necessarily limited to the above-described example. For example, in accordance with another embodiment, the insulative film INF may be omitted.

In accordance with one or more embodiments, in case that the insulative film INF is provided to cover the surface of the light emitting element LD, particularly, the outer surface of the active layer AL, the electrical stability of the light emitting element LD can be ensured. Also, in case that the insulative film INF is provided on the surface of the light emitting element LD, a surface defect of the light emitting element LD may be minimized, thereby improving the lifetime and efficiency of the light emitting element LD. Even in case that light emitting elements LD are densely disposed, an unwanted short circuit can be prevented from occurring between the light emitting elements LD.

The electrode layer ELL may be disposed on the first semiconductor layer SCL1. The electrode layer ELL may be adjacent to the first end portion EP1. The electrode layer ELL may be electrically connected to the first semiconductor layer SCL1.

A portion of the electrode layer ELL may be exposed. For example, the insulative film INF may expose a surface of the electrode layer ELL. The electrode layer ELL may be exposed in an area corresponding to the first end portion EP1.

In some embodiments, a side surface of the electrode layer ELL may be exposed. For example, the insulative film INF may not cover at least a portion of the side surface of the electrode layer ELL while covering a side surface of each of the first semiconductor layer SCL1, the active layer AL, and the second semiconductor layer SCL2. Thus, the electrode layer ELL adjacent to the first end portion EP1 can be easily connected to another component. In some embodiments, the insulating layer INF may expose not only the side surface of the electrode layer ELL but also a portion of a side surface of the first semiconductor layer SCL1 and/or the second semiconductor layer SCL2.

In accordance with one or more embodiments, the electrode layer ELL may be an ohmic contact electrode. However, the disclosure is not necessarily limited to the above-described example. For example, the electrode layer ELL may be a Schottky contact electrode.

In accordance with one or more embodiments, the electrode layer ELL may include at least one of chromium (Cr), titanium (Ti), aluminum (Al), gold (Au), nickel (Ni), and any oxide or ally thereof. However, the disclosure is not necessarily limited to the above-described example. In some embodiments, the electrode layer ELL may be substantially transparent. For example, the electrode layer ELL may include indium tin oxide (ITO). Accordingly, emitted light can be transmitted through the electrode layer ELL.

The structure, shape, and the like of the light emitting element LD are not limited to the above-described example. In some embodiments, the light emitting element LD may have various structures and various shapes. For example, the light emitting element LD may further include an additional electrode layer which may be disposed on a surface of the second semiconductor layer SCL2 and may be adjacent to the second end portion EP2.

Figure 3:
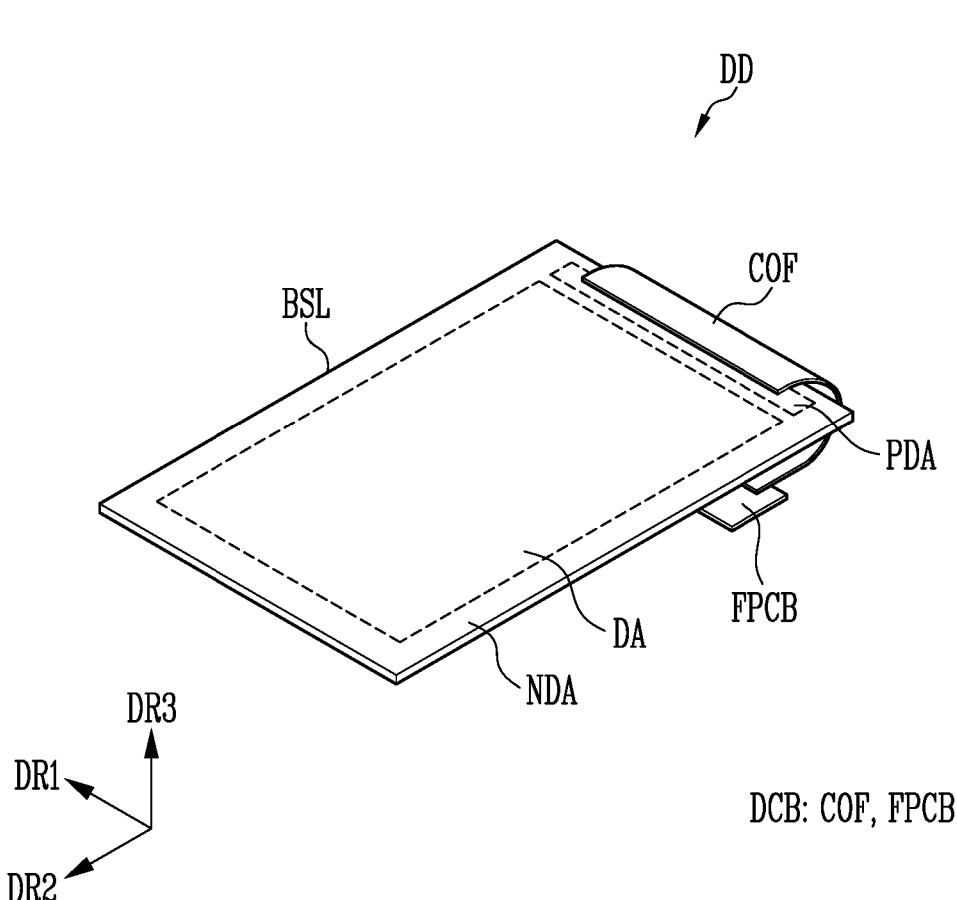
FIG. 3 is a schematic perspective view illustrating a display device in accordance with one or more embodiments of the disclosure.
Figure 4:
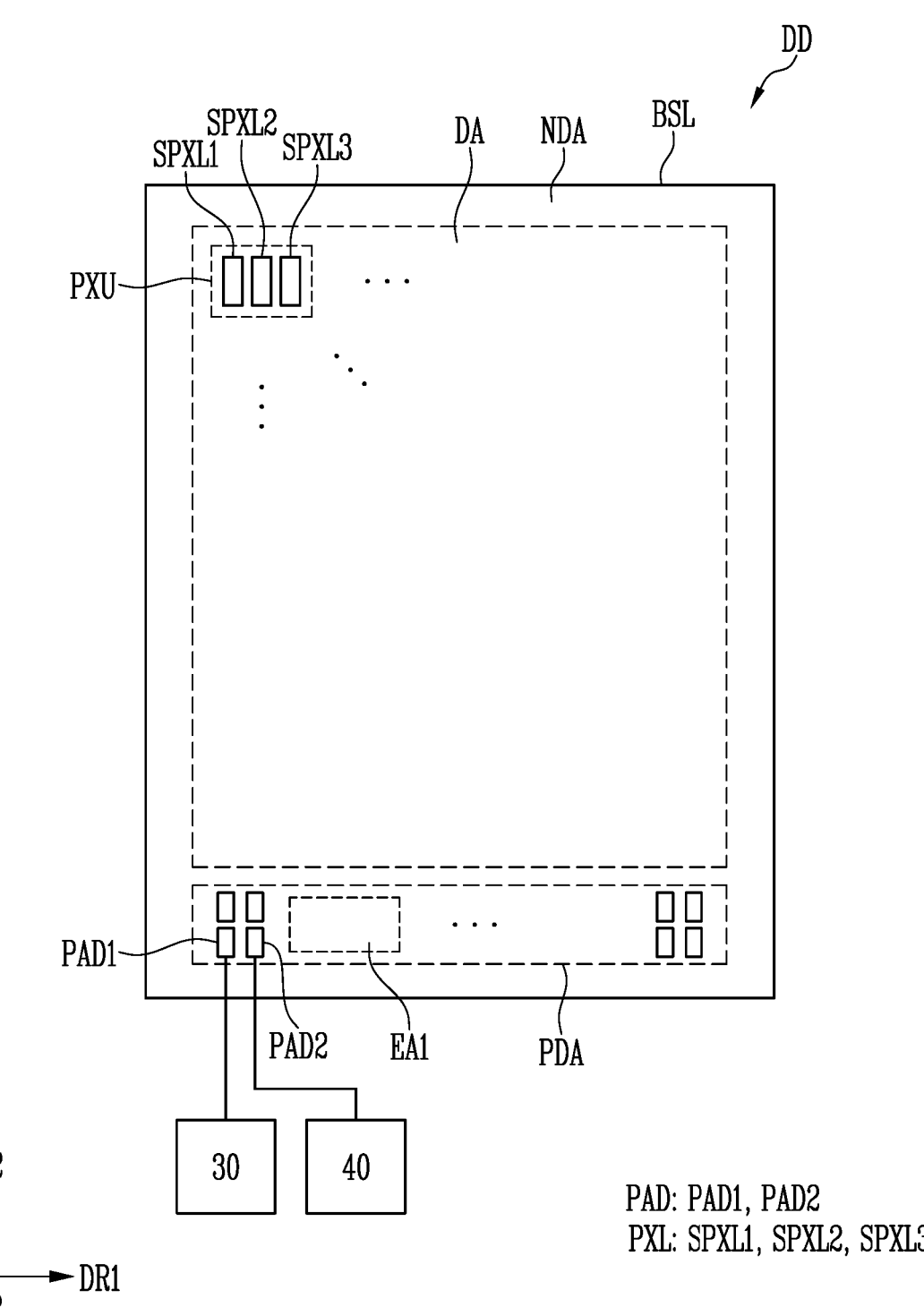
FIG. 4 is a schematic plan view illustrating the display device of FIG. 3.

A display device DD including the light emitting element LD in accordance with one or more embodiments of the disclosure will be described. FIG. 3 is a schematic perspective view illustrating a display device in accordance with one or more embodiments of the disclosure. FIG. 4 is a schematic plan view illustrating the display device of FIG. 3.

Referring to FIGS. 3 and 4, the display device DD may provide light. The display device DD may include a base layer BSL, pads PAD, and pixels PXL. The display device DD may further include a scan driver 30, a data driver 40, and a driving circuit member DCB.

The base layer BSL may form (or constitute) a base surface of the display device DD. The base layer BSL may include a rigid material or a flexible material according to a purpose of the display device DD. The base layer BSL may include a flexible or rigid substrate or film. In some embodiments, the base layer BSL may be substantially transparent, or have reflexibility. However, the material of the base layer BSL applied to the embodiment of the disclosure is not limited to a specific example.

The display device DD (or the base layer BSL) may include a display area DA and a non-display area NDA. The display area DA may be an area in which the pixel PXL may be provided. The non-display area NDA may be an area in which the pixel PXL may not be provided. Light emitted from the pixel PXL may be output in the display area DA. The light may be emitted in a display direction of the display device DD (e.g., a third direction DR3) in the display area DA. The light may not be provided in the non-display area NDA. The non-display area NDA may include an area except the display area DA.

The pixel PXL may include a light emitting element LD, and provide light. The pixel PXL may be disposed on the base layer BSL in the display area DA.

The pixel PXL may emit light, based on a signal provided from the scan driver 30 and/or a signal provided from the data driver 40.

The pixel PXL may include a first sub-pixel SPXL1, a second sub-pixel SPXL2, and a third sub-pixel SPXL3. The pixel PXL may include a pixel unit PXU. The pixel unit PXU may be disposed in the display area DA. The pixel unit PXU may include the first sub-pixel SPXL1, the second sub-pixel SPXL2, and/or the third sub-pixel SPXL3. Hereinafter, when at least one pixel among the first sub-pixel SPXL1, the second sub-pixel SPXL2, and the third sub-pixel SPXL3 is arbitrarily designated or when two or more kinds of pixels among the first sub-pixel SPXL1, the second sub-pixel SPXL2, and the third sub-pixel SPXL3 are inclusively designated, the corresponding pixel or the corresponding pixels will be referred to as a "pixel PXL" or "pixels PXL."

The pixels PXL may be regularly arranged according to a stripe arrangement structure, a PenTile® arrangement structure, or the like. However, the arrangement structure of the pixels PXL is not limited thereto, and the pixels PXL may be arranged in the display area DA in various structures and/or various manners.

In accordance with one or more embodiments, first sub-pixels SPXL1 emitting light of a first color, second sub-pixels SPXL2 emitting light of a second color, and third sub-pixels SPXL3 emitting light of a third color may be arranged in the display area DA. At least one first sub-pixel SPXL1, a least one second sub-pixel SPXL2, and at least one third sub-pixel SPXL3, which may be disposed adjacent to each other, may constitute a pixel unit PXU capable of emitting lights of various colors. For example, each of the first to third sub-pixels SPXL1, SPXL2, and SPXL3 may be a pixel emitting light of a color. In some embodiments, the first sub-pixel SPXL1 may be a red pixel emitting light of red, the second sub-pixel SPXL2 may be a green pixel emitting light of green, and the third sub-pixel SPXL3 may be a blue pixel emitting light of blue. However, the disclosure is not limited thereto.

In some embodiments, light emitting elements LD disposed in each of the first to third sub-pixels SPXL1, SPXL2, and SPXL3 may emit light of the same color. A color conversion layer CCL (see FIG. 7) and/or a color filter layer CFL (see FIG. 7) may be disposed above the light emitting elements LD, so that the first to third sub-pixels SPXL1, SPXL2, and SPXL3 provide light of different colors. In other embodiments, the light emitting elements LD disposed in each of the first to third sub-pixels SPXL1, SPXL2, and SPXL3 may emit light of different colors. However, the color, kind, and/or number of pixels PXL constituting the pixel unit PXU are not limited to a specific example.

The scan driver 30 may output a scan signal. The scan driver 30 may provide the scan signal along a scan line. The data driver 40 may output (or provide) a data signal. The data driver 40 may provide the data signal.

Each of the scan driver 30 and the data driver 40 may be connected to lines of the display device DD. In some embodiments, the scan driver 30 and the data driver 40 may be provided on a flexible circuit member FPCB, and an electrical signal provided by the scan driver 30 and the data driver 40 may be provided to the pixels PXL through a chip on film COF and the pads PAD. However, the positions of the scan driver 30 and the data driver 40 are not limited to the above-described example. In some embodiments, the scan driver 30 and/or the data driver 40 may be mounted in the non-display area NDA.

Various lines, the pads PAD, and/or a built-in circuit, which are connected to the pixels PXL of the display area DA, may be disposed in the non-display area NDA.

A pad area PDA may be disposed in the non-display area NDA. The non-display area NDA may include the pad area PDA. The pad area PDA may be disposed at a side of the display area DA. Although a case where the pad area PDA may be disposed adjacent to a lower side of the display area DA is illustrated in FIGS. 3 and 4, the disclosure is not limited thereto.

The pad PAD may be disposed in the pad area PDA. Multiple pads PAD may be disposed. In some embodiments, the pads PAD may include a first pad PAD1 and a second pad PAD2. The first pad PAD1 may be a gate pad, and the second pad PAD2 may be a data pad. The first pad PAD1 may be connected to the scan driver 30. A scan signal provided from the scan driver 30 may be transferred to a scan line for the pixel PXL via the first pad PAD1. The second pad PAD2 may be connected to the data driver 40. A data signal provided from the data driver 40 may be transferred to a data line for the pixel PXL via the second pad PAD2. The positions of the first pad PAD1 and the second pad PAD2 are not particularly limited in the pad area PDA.

The driving circuit member DCB may include the chip on film COF and the flexible circuit member FPCB.

The chip on film COF may apply (or provide) an electrical signal acquired based on a signal applied from the flexible circuit member FPCB to a component (e.g., the pixel PXL) in the display area DA. The chip on film COF may apply (or provide) the electrical signal based on the signal provided from the flexible circuit member FPCB to the pad PAD.

An end of the chip on film COF may be connected (or attached) to the base layer BSL. Another end of the chip on film COF may be connected (or attached) to the flexible circuit member FPCB. At least a portion of the chip on film may be bent.

The chip on film COF may overlap the pad area PDA in a plan view. For example, an end of the chip on film COF may be connected (or attached) to the pad area PDA. In some embodiments, at least a portion of the chip on film COF may be electrically connected to the pads PAD in the pad area PDA. Accordingly, the electrical signal provided from the flexible circuit member FPCB may be applied (or provided) to the pads PAD through the chip on film COF. For example, a first area of the chip on film COF may be electrically connected to the first pad PAD1, and a second area of the chip on film COF may be electrically connected to the second pad PAD2.

The chip on film COF may include an insulating film and lines provided on the insulating film. The chip on film COF generally refers to a form in which an insulating film configured as a thin film and lines formed on the insulating film may be formed, and may be designated as a tape carrier package, a flexible printed circuit board, or the like. In the chip on film COF, although not shown in the drawings, a semiconductor chip connected to at least some (e.g., a subset of the lines may be further mounted on the insulating film.

A circuit element may process an electrical signal which may be applied to the pixel PXL and may be disposed on the flexible circuit member FPCB. In some embodiments, the flexible circuit member FPCB may be a flexible circuit board.

The flexible circuit member FPCB may be disposed on a surface (e.g., a back surface) of the base layer BSL. An end portion of the flexible circuit member FPCB may be connected to the chip on film COF having a bent shape, to be disposed on the back surface of the base layer BSL, and accordingly, the flexible circuit member FPCB may not be viewed from the outside.

A pixel PXL (or sub-pixel SPXL) in accordance with one or more embodiments of the disclosure will be described with reference to FIGS. 5 to 8. FIGS. 5 to 8 are views illustrating a pixel PXL (or sub-pixel SPXL) in accordance with one or more embodiments of the disclosure. In FIGS. 5 to 8, descriptions of portions overlapping with those described above will be simplified or will not be repeated.

Figure 5:
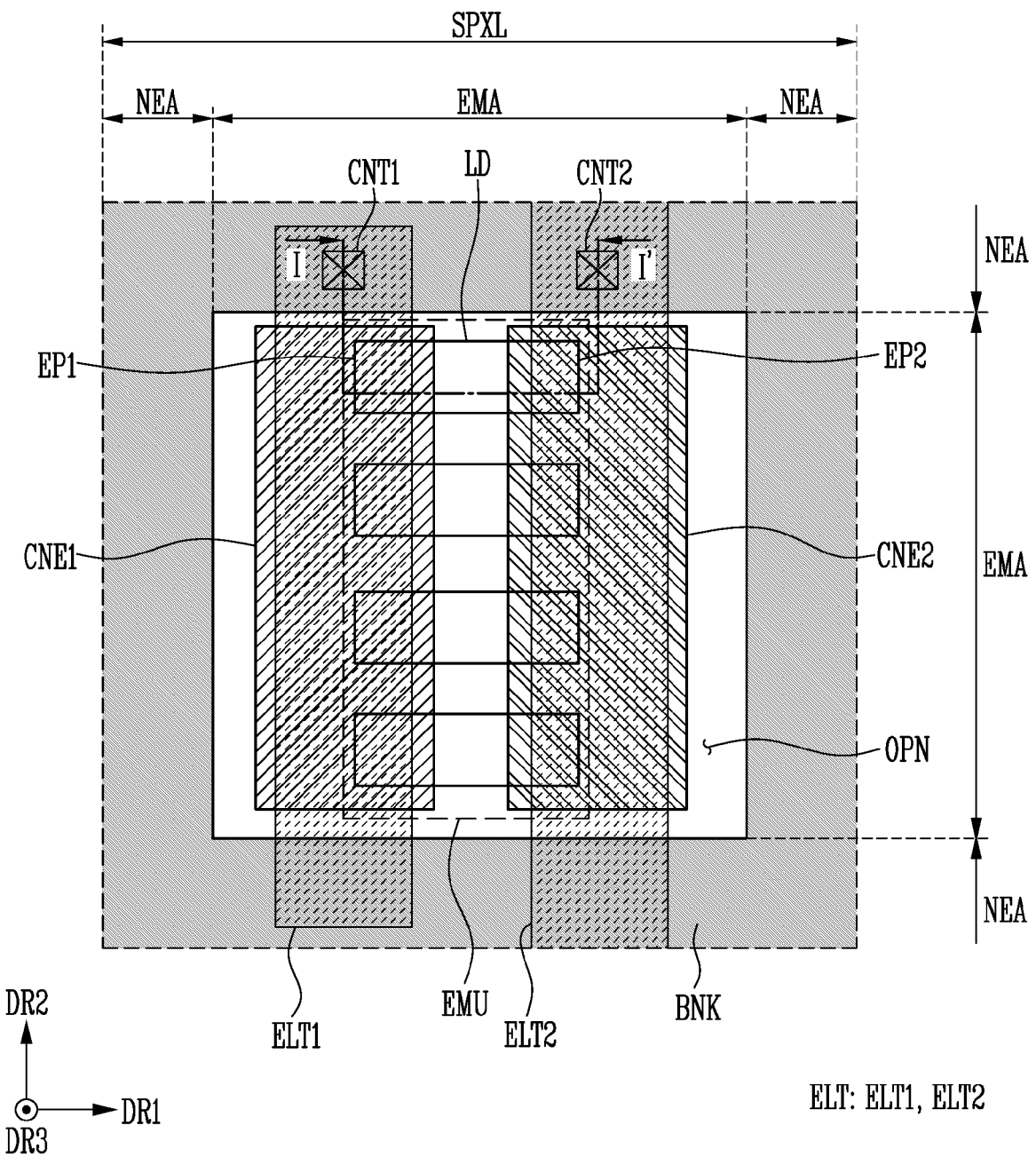
FIG. 5 is a schematic plan view illustrating a sub-pixel in accordance with one or more embodiments of the disclosure.

First, a planar structure of a sub-pixel SPXL will be described with reference to FIG. 5. FIG. 5 is a schematic plan view illustrating a sub-pixel in accordance with one or more embodiments of the disclosure. The sub-pixel SPXL shown in FIG. 5 may be one of the first to third sub-pixels SPXL1, SPXL2, and SPXL3 described above with reference to FIG. 4.

The sub-pixel SPXL may include an emission area EMA and a non-emission area NEA. The sub-pixel SPXL may include a bank BNK, an alignment electrode ELT, light emitting elements LD, a first contact electrode CNE1, and a second contact electrode CNE2.

The emission area EMA may overlap an opening OPN defined by the bank BNK in a plan view. The light emitting elements LD may be disposed in the emission area EMA.

The light emitting elements LD may not be disposed in the non-emission area NEA. A portion of the non-emission area NEA may overlap the bank BNK in a plan view.

The bank BNK may form (or provide) the opening OPN. For example, the bank BNK may have a shape protruding in a thickness direction of the base layer BSL (e.g., the third direction DR3), and have a shape surrounding an area. Accordingly, the opening OPN in which the bank BNK is not disposed can be formed.

The bank BNK may form a space. The bank BNK may have a shape surrounding a partial area in a plan view. The space may mean an area in which a fluid can be accommodated. In accordance with one or more embodiments, the bank BNK may include a first bank (see 'BNK1' shown in FIG. 6) and a second bank (see 'BNK2' shown in FIG. 6).

In accordance with one or more embodiments, an ink including the light emitting elements LD may be provided in a space defined by the bank BNK (e.g., the first bank BNK1), so that the light emitting elements LD are disposed in the opening OPN.

In accordance with one or more embodiments, a color conversion layer (see 'CCL' shown in FIG. 7) may be disposed (or patterned) in a space defined by the bank BNK (e.g., the second bank BNK2).

The bank BNK may define the emission area EMA and the non-emission area NEA. The bank BNK may surround at least a portion of the emission area EMA in a plan view. For example, an area in which the bank BNK may be disposed may be the non-emission area NEA. An area in which the light emitting elements LD are disposed as an area in which the bank BNK is not disposed may be the emission area EMA.

The alignment electrode ELT may be an electrode for aligning the light emitting elements LD. In some embodiments, the alignment electrode ELT may include a first electrode ELT1 and a second electrode ELT2. The alignment electrode ELT may be designated as an "electrode" or "electrodes."

The alignment electrode ELT may have a single layer structure or a multi-layer structure. For example, the alignment electrode ELT may include at least one reflective electrode layer including a reflective conductive material, and selectively further include at least one transparent electrode layer and/or at least one conductive capping layer. In some embodiments, the alignment electrode ELT may include at least one of silver (Al), magnesium (Mg), aluminum (Al), platinum (Pt), palladium (Pd), gold (Au), nickel (Ni), neodymium (Nd), iridium (Ir), chromium (Cr), titanium (Ti), and any alloy thereof. However, the disclosure is not limited to the above-described example, and the alignment electrode ELT may include at least one of various materials having reflexibility. However, the disclosure is not limited to the above-described example.

The light emitting element LD may be disposed on the alignment electrode ELT. In some embodiments, at least a portion of the light emitting element LD may be disposed between the first electrode ELT1 and the second electrode ELT2. The light emitting element LD may be aligned between the first electrode ELT1 and the second electrode ELT2. The light emitting elements LD may form (or constitute) a light emitting unit EMU. The light emitting unit EMU may mean a unit including adjacent light emitting elements LD.

In some embodiments, the light emitting elements LD may be aligned in various manners. For example, an embodiment in which the light emitting elements LD are aligned in parallel between the first electrode ELT1 and the second electrode ELT2 is illustrated in FIG. 5. However, the disclosure is not necessarily limited to the above-described example. For example, the light emitting elements LD may be aligned in a series or series/parallel hybrid structure, and the number of units connected in series and/or parallel is not particularly limited.

The first electrode ELT1 and the second electrode ELT2 may be spaced apart from each other. For example, the first electrode ELT1 and the second electrode ELT2 may be space apart from each other along a first direction DR1 in the emission area EMA, and each of the first electrode ELT1 and the second electrode ELT2 may extend along a second direction DR2.

In accordance with one or more embodiments, the first electrode ELT1 and the second electrode ELT2 may be electrodes for aligning the light emitting elements LD. The first electrode ELT1 may be a first alignment electrode, and the second electrode ELT2 may be a second alignment electrode.

The first electrode ELT1 and the second electrode ELT2 may be respectively supplied (or provided) with a first alignment signal and a second alignment signal in a process of aligning the light emitting elements LD. For example, the ink INK including the light emitting elements LD may be supplied (or provided) to the opening OPN defined by the bank BNK (e.g., the first bank BNK1), the first alignment signal may be supplied to the first electrode ELT1, and the second alignment signal may be supplied to the second electrode ELT2. The first alignment signal and the second alignment signal may have different waveforms, different potentials, and/or different phases. For example, the first alignment signal may be an AC signal, and the second alignment signal may be a ground signal. However, the disclosure is not necessarily limited to the above-described example. An electric field may be formed between (or on) the first electrode ELT1 and the second electrode ELT2, so that the light emitting elements LD are aligned between the first electrode ELT1 and the second electrode ELT2, based on the electric field. For example, the light emitting elements LD may be moved (or rotated) by a force (a dielectrophoresis (DEP) force) according to the electric field to be aligned (or disposed) on the alignment electrode ELT.

The first electrode ELT1 may be electrically connected to a circuit element (e.g., a transistor (see 'TR' shown in FIG. 6)) through a first contact member CNT1. In some embodiments, the first electrode ELT1 may provide an anode signal for allowing the light emitting element LD to emit light. The first electrode ELT1 may provide the first alignment signal for aligning the light emitting element LD.

The second electrode ELT2 may be electrically connected to a power line (see 'PL' shown in FIG. 6) through a second contact member CNT2. In some embodiments, the second electrode ELT2 may provide a cathode signal for allowing the light emitting element LD to emit light. The second electrode ELT2 may provide the second alignment signal for aligning the light emitting element LD.

The positions of the first contact member CNT1 and the second contact member CNT2 are not limited to positions shown in FIG. 5, and may be appropriately variously changed.

The light emitting element LD may emit light, based on an electrical signal provided thereto. For example, the light emitting element LD may provide light, based on a first electrical signal (e.g., the anode signal) provided from the first contact electrode CNE1 and a second electrical signal (e.g., the cathode signal) provided from the second contact electrode CNE2.

A first end portion EP1 of the light emitting element LD may be disposed adjacent to the first electrode ELT1, and a second end portion EP2 may be disposed adjacent to the second electrode ELT2. The first end portion EP1 may or may not overlap the first electrode ELT1. The second end portion EP2 may or may not overlap the second electrode ELT2.

In accordance with one or more embodiments, the first end portion EP1 of each of the light emitting elements LD may be electrically connected to the first electrode ELT1 through the first contact electrode CNE1. In another embodiment, the first end portion EP1 of each of the light emitting elements LD may be directly connected to the first electrode ELT1. In still another embodiment, the first end portion EP1 of each of the light emitting elements LD may be electrically connected to only the first contact electrode CNE1, and may not be connected to the first electrode ELT1.

Similarly, the second end portion EP2 of each of the light emitting elements LD may be electrically connected to the second electrode ELT2 through the second contact electrode CNE2. In another embodiment, the second end portion EP2 of each of the light emitting elements LD may be directly connected to the second electrode ELT2. In still another embodiment, the second end portion EP2 of each of the light emitting elements LD may be electrically connected to only the second contact electrode CNE2, and may not be connected to the second electrode ELT2.

The first contact electrode CNE1 and the second contact electrode CNE2 may be respectively disposed on the first end portions EP1 and the second end portions EP2 of the light emitting elements LD.

The first contact electrode CNE1 may be disposed on the first end portions EP1 of the light emitting elements LD to be electrically connected to the first end portions EP1. In an embodiment, the first contact electrode CNE1 may be disposed on the first electrode ELT1 to be electrically connected to the first electrode ELT1. The first end portions EP1 of the light emitting elements LD may be connected to the first electrode ELT1 through the first contact electrode CNE1.

The second contact electrode CNE2 may be disposed on the second end portions EP2 of the light emitting elements LD to be electrically connected to the second end portions EP2. In an embodiment, the second contact electrode CNE2 may be disposed on the second electrode ELT2 to be electrically connected to the second electrode ELT2. The second end portions EP2 of the light emitting elements LD may be connected to the second electrode ELT2 through the second contact electrode CNE2.

Figure 6:
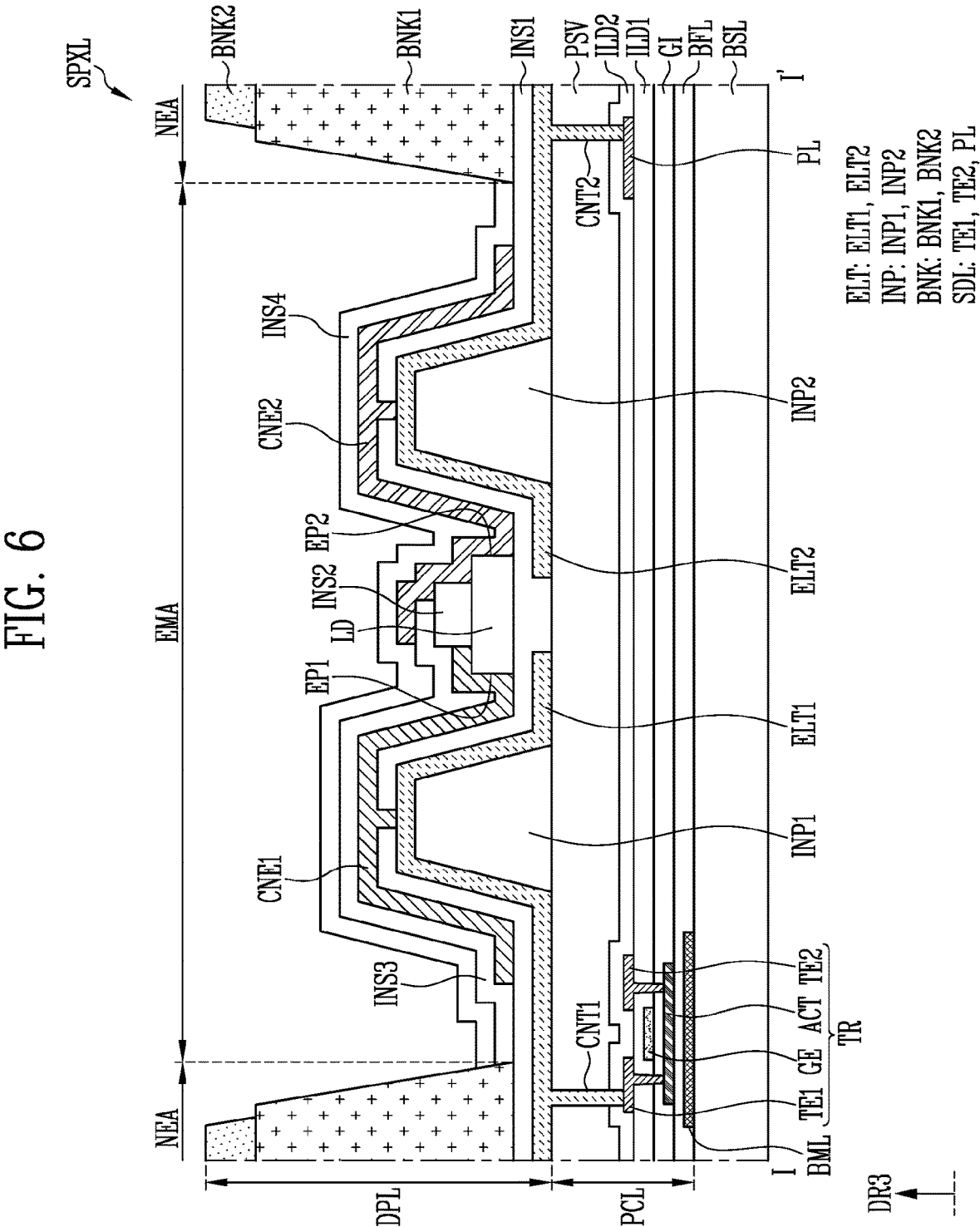
FIG. 6 is a schematic sectional view illustrating a sub-pixel in accordance with one or more embodiments of the disclosure.
Figure 7:
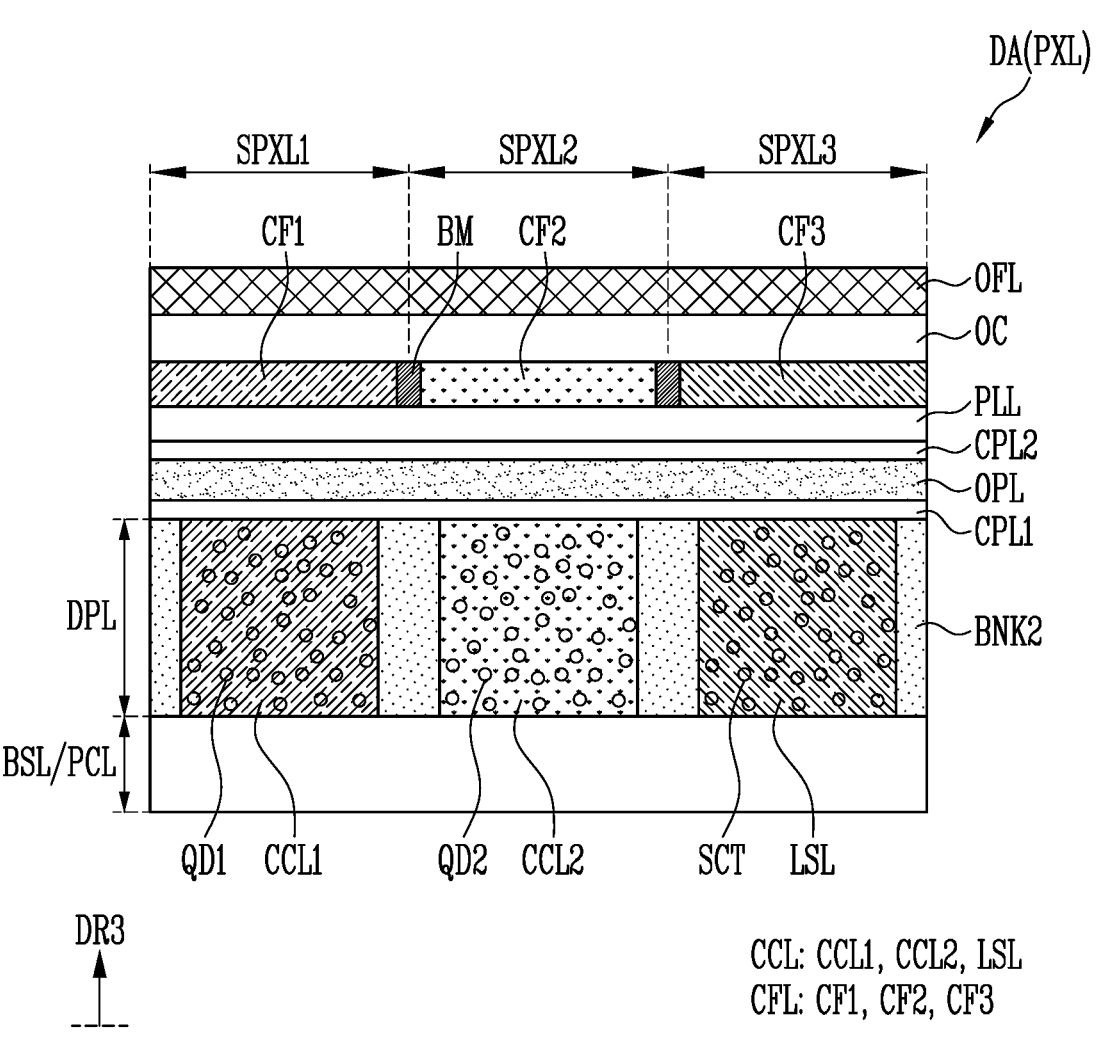
FIG. 7 is a schematic sectional view illustrating a pixel in accordance with one or more embodiments of the disclosure.
Figure 8:
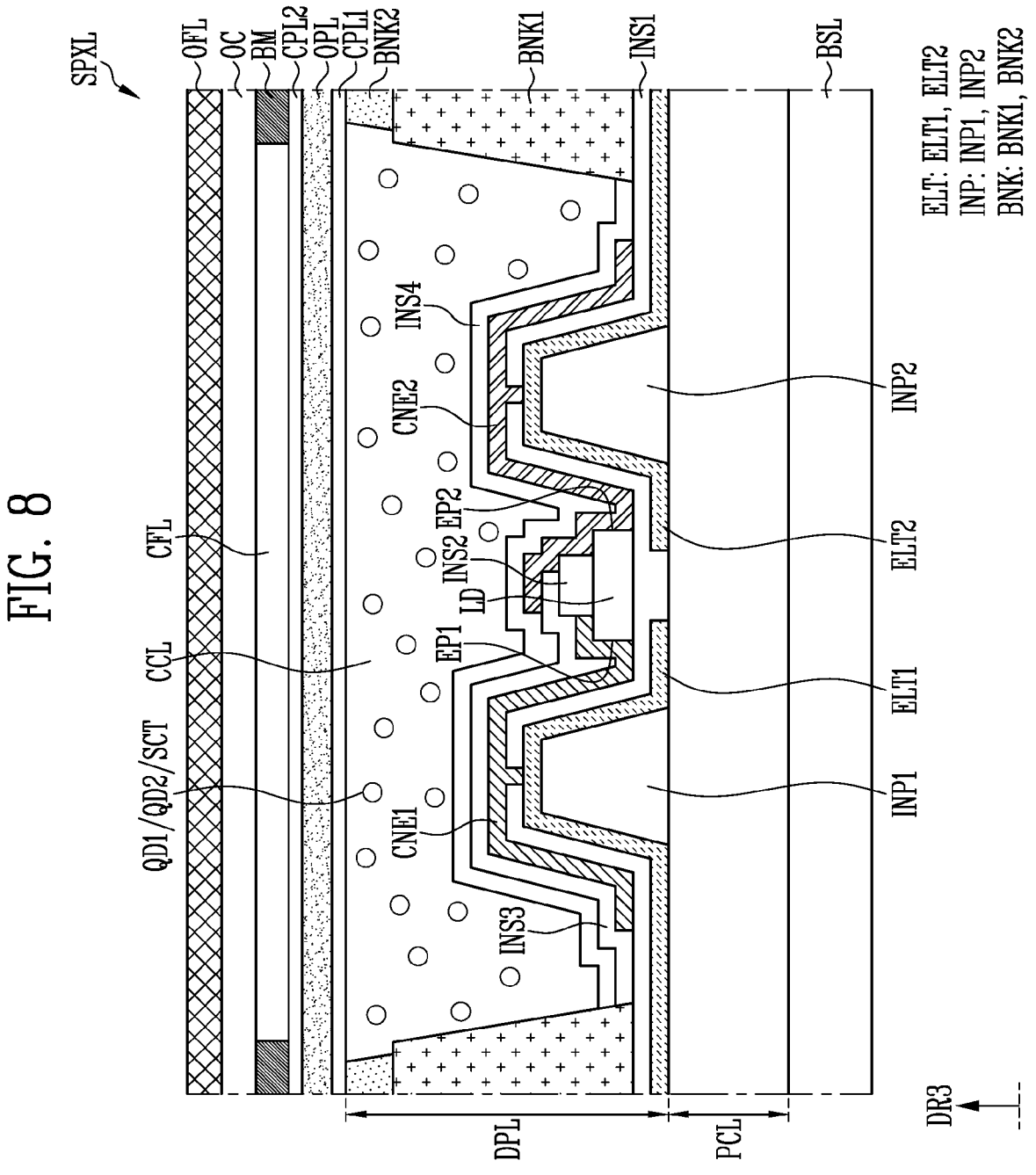
FIG. 8 is a schematic sectional view illustrating a sub-pixel in accordance with one or more embodiments of the disclosure.

A sectional structure of a pixel PXL (or sub-pixel SPXL) will be described with reference to FIGS. 6 to 8. Specifically, a pixel circuit layer PCL and a display element layer DPL of the sub-pixel SPXL will be described with reference to FIG. 6. An optical layer OPL, a color filter layer CFL, and an outer film layer OFL will be described with reference to FIGS. 7 and 8. In FIGS. 6 to 8, descriptions of portions overlapping with those described above will be simplified or will not be repeated.

FIG. 6 is a schematic sectional view illustrating a sub-pixel in accordance with one or more embodiments of the disclosure. FIG. 7 is a schematic sectional view illustrating a pixel in accordance with one or more embodiments of the disclosure. FIG. 8 is a schematic sectional view illustrating a sub-pixel in accordance with one or more embodiments of the disclosure.

Referring to FIG. 6, the sub-pixel SPXL may be disposed on a base layer BSL. The sub-pixel SPXL may include a pixel circuit layer PCL and a display element layer DPL.

The base layer BSL may form a base member on which the sub-pixel SPXL may be formed. The base layer BSL may provide an area on which the pixel circuit layer PCL and the display element layer DPL can be disposed.

The pixel circuit layer PCL may be disposed on the base layer BSL. The pixel circuit layer PCL may include a lower auxiliary electrode BML, a buffer layer BFL, a transistor TR, a gate insulating layer GI, a first interlayer insulating layer ILD1, a second interlayer insulating layer ILD2, and a protective layer PSV.

The lower auxiliary electrode BML may be disposed on the base layer BSL. The lower auxiliary electrode BML may serve as a path through which an electrical signal may be moved. In some embodiments, a portion of the lower auxiliary electrode BML may overlap the transistor TR in a plan view.

The buffer layer BFL may be disposed on the base layer BSL. The buffer layer BFL may cover the lower auxiliary electrode BML. The buffer layer BFL may prevent an impurity from being diffused from the outside. The buffer layer BFL may include at least one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not limited to the above-described example.

The transistor TR may be a thin film transistor. In accordance with one or more embodiments, the transistor TR may be a driving transistor. The transistor TR may be electrically connected to a light emitting element LD. The transistor TR may be electrically connected to a first end portion EP1 of the light emitting element LD.

The transistor TR may include an active layer ACT, a first transistor electrode TE1, a second transistor electrode TE2, and a gate electrode GE.

The active layer ACT may mean a semiconductor layer. The active layer ACT may be disposed on the buffer layer BFL. The active layer ACT may include at least one selected from the group consisting of poly-silicon, Low Temperature Polycrystalline Silicon (LTPS), amorphous silicon, and an oxide semiconductor.

The active layer ACT may include a first contact region in contact with the first transistor electrode TE1 and a second contact region in contact with the second transistor electrode TE2. The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate electrode GE may be disposed on the gate insulating layer GI. A position of the gate electrode GE may correspond to that of the channel region of the active pattern ACT. For example, the gate electrode GE may be disposed on the channel region of the active pattern ACT with the gate insulating layer GI interposed therebetween.

The gate insulating layer GI may be disposed on the buffer layer BFL. The gate insulating layer GI may cover the active pattern ACT. The gate insulating layer GI may include at least one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not limited to the above-described example.

The first interlayer insulating layer ILD1 may be disposed on the gate insulating layer GI. The first interlayer insulating layer ILD1 may cover the gate electrode GE. The first interlayer insulating layer ILD1 may include at least one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not necessarily limited to the above-described example.

The first transistor electrode TE1 and the second transistor electrode TE2 may be disposed on the first interlayer insulating layer ILD1. The first transistor electrode TE1 may be in contact with the first contact region of the active pattern ACT while penetrating the gate insulating layer GI and the first interlayer insulating layer ILD1, and the second transistor electrode TE2 may be in contact with the second contact region of the active pattern ACT while penetrating the gate insulating layer GI and the first interlayer insulating layer ILD1. In an example, the first transistor electrode TE1 may be a drain electrode, and the second transistor electrode TE2 may be a source electrode. However, the disclosure is not limited thereto.

The first transistor electrode TE1 may be electrically connected to a first electrode ELT1 through a first contact member CNT1 penetrating the protective layer PSV and the second interlayer insulating layer ILD2.

A power line PL may be disposed on the first interlayer insulating layer ILD1. In some embodiments, the power line PL may be displayed in the same layer as the first transistor electrode TE1 and the second transistor TE2. The power line PL may be electrically connected to a second electrode ELT2 through a second contact member CNT2. The power line PL may supply a power source or an alignment signal through the second electrode ELT2.

In accordance with one or more embodiments, the layer in which the first transistor electrode TE1, the second transistor TE2, and the power line PL are disposed may be a source/drain layer SDL. The source/drain layer SDL may include multiple layers disposed in the same layer. For example, the source/drain layer SDL may include the first transistor electrode TE1, the second transistor TE2, and the power line PL.

The second interlayer insulating layer ILD2 may be disposed on the first interlayer insulating layer ILD1. The second interlayer insulating layer ILD2 may cover the first transistor electrode TE1, the second transistor electrode TE2 and the power line PL. The second interlayer insulating layer ILD2 may include at least one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not limited to the above-described example.

The protective layer PSV may be disposed on the second interlayer insulating layer ILD2. In some embodiments, the protective layer PSV may be a via layer. The protective layer PSV may include an organic material to planarize a lower step difference. For example, the protective layer PSV may include an organic material such as acrylic resin, epoxy resin, phenolic resin, polyamide resin, polyimide resin, unsaturated polyester resin, poly-phenylene ether resin, poly-phenylene sulfide resin, and/or benzocyclobutene (BCB). However, the disclosure is not necessarily limited thereto, and the protective layer PSV may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In accordance with one or more embodiments, the sub-pixel SPXL may include the first contact member CNT1 and the second contact member CNT2. The first contact member CNT1 and the second contact member CNT2 may penetrate the second interlayer insulating layer ILD2, the protective layer PSV, and a first insulating layer INS1 (or a first insulating reflective layer 120). The first electrode ELT1 and the first transistor electrode TE1 may be electrically connected to each other through the first contact member CNT1. The second electrode ELT2 and the power line PL may be electrically connected to each other through the second contact member CNT2.

The display element layer DPL may be disposed on the pixel circuit layer PCL. The display element layer DPL may include a first insulating layer INS1, an insulating pattern INP, an alignment electrode ELT, a bank BNK, the light emitting element LD, a second insulating layer INS2, a first contact CNE1, a third insulating layer INS3, a second contact electrode CNE2, and a fourth insulating layer INS4.

The insulating pattern INP may be formed on the protective layer PSV. The insulating pattern INP may have various shapes in some embodiments. In an embodiment, the insulating pattern INP may protrude in the thickness direction of the base layer BSL (e.g., the third direction DR3). Also, the insulating pattern INP may be formed to have an inclined surface inclined at an angle with respect to the base layer BSL. However, the disclosure is not necessarily limited thereto, and the insulating pattern INP may have a sidewall with a curved shape, a stepped shape, or the like. In an example, the insulating pattern INP may have a section having a semicircular shape, a semi-elliptical shape, or the like.

The insulating pattern INP may function to form a step difference such that light emitting elements LD can be easily aligned in the emission area. In some embodiments, the insulating pattern INP may be a partition wall.

In accordance with one or more embodiments, a portion of the alignment electrode ELT may be disposed over the insulating pattern INP. For example, the insulating pattern INP may include a first insulating pattern INP1 and a second insulating pattern INP2. The first electrode ELT1 may be disposed over the first insulating pattern INP1, and the second electrode ELT2 may be disposed over the second insulating pattern INP2. Therefore, a reflective wall may be formed over the insulating pattern INP. Accordingly, light emitted from the light emitting element LD may be recycled, so that the light emission efficiency of the display device DD (or the pixel PXL) can be improved.

The insulating pattern INP may include at least one organic material and/or at least one inorganic material. In an example, the insulating pattern INP may include an organic material such as acrylic resin, epoxy resin, phenolic resin, polyamide resin, polyimide resin, unsaturated polyester resin, poly-phenylene ether resin, poly-phenylene sulfide resin, and/or benzocyclobutene (BCB). However, the disclosure is not necessarily limited thereto, and the insulating pattern INP may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The alignment electrode ELT may be disposed on the protective layer PSV and/or the insulating pattern INP. As described above, a portion of the alignment electrode ELT may be disposed over the insulating pattern INP, to form a reflective wall. An alignment signal (e.g., an AC signal or a ground signal) for aligning the light emitting element LD may be supplied to the alignment electrode ELT. In some embodiments, an electrical signal (e.g., an anode signal and a cathode signal) for allowing the light emitting element LD to emit light may be supplied to the alignment electrode ELT.

In accordance with one or more embodiments, the alignment electrode ELT may be disposed on a back surface of the first insulating layer INS1. For example, the alignment electrode ELT may be disposed between the insulating pattern INP or the protective layer PSV and the first insulating layer INS1. For example, a surface of the alignment electrode ELT may be in contact with the first insulating layer INS1.

The first electrode ELT1 may be electrically connected to the light emitting element LD. The first electrode ELT1 may be electrically connected to the first contact electrode CNE1 through a contact hole formed in the first insulating layer INS1. The first electrode ELT1 may apply an anode signal for allowing the light emitting element LD to emit light.

The second electrode ELT2 may be electrically connected to the light emitting element LD. The second electrode ELT2 may be electrically connected to the second contact electrode CNE2 through a contact hole formed in the first insulating layer INS1. The second electrode ELT2 may apply a cathode signal (e.g., a ground signal) for allowing the light emitting element LD to emit light.

The first insulating layer INS1 may be disposed over the alignment electrode ELT. For example, the first insulating layer INS1 may cover the first electrode ELT1 and the second electrode ELT2.

The bank BNK may be disposed on the first insulating layer INS1. In some embodiments, the bank BNK may include a first bank BNK1 and a second bank BNK2.

The first bank BNK1 may be disposed on the first insulating layer INS1. In some embodiments, in a plan view, first bank BNK1 may not overlap the emission area EMA, and may overlap the non-emission area NEA. As described above, the first bank BNK1 may protrude in the thickness direction of the base layer BSL (e.g., the third direction DR3), thereby defining an opening OPN, and a space in which the light emitting elements LD can be provided may be formed in the opening OPN in a process of supplying the light emitting elements LD.

The first bank BNK1 may include an organic material such as acrylic resin, epoxy resin, phenolic resin, polyamide resin, polyimide resin, unsaturated polyester resin, poly-phenylene ether resin, poly-phenylene sulfide resin, or benzocyclobutene (BCB). However, the disclosure is not necessarily limited thereto, and the first bank BNK1 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The second bank BNK2 may be disposed on the first bank BNK1. The second bank BNK2 may protrude in the thickness direction of the base layer BSL (e.g., the third direction DR3), thereby defining an opening OPN, and a space in which a color conversion layer CCL may be provided may be formed in the opening OPN.

The second bank BNK2 may include an organic material such as acrylic resin, epoxy resin, phenolic resin, polyamide resin, polyimide resin, unsaturated polyester resin, poly-phenylene ether resin, poly-phenylene sulfide resin, and/or benzocyclobutene (BCB). However, the disclosure is not necessarily limited thereto, and the second bank BNK2 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The light emitting element LD may be disposed on the second insulating reflective layer 140. In some embodiments, the light emitting element LD may emit light, based on an electrical signal (e.g., an anode signal and a cathode signal) provided from the first contact electrode CNE1 and the second contact electrode CNE2.

The light emitting element LD may be disposed in an area surrounded by the first bank BNK1. The light emitting element LD may be disposed between the first insulating pattern INP1 and the second insulating pattern INP2.

The second insulating layer INS2 may be disposed on the light emitting element LD. The second insulating layer INS2 may cover an active layer AL of the light emitting element LD.

The second insulating layer INS2 may expose at least a portion of the light emitting element LD. For example, the second insulating layer INS2 may not cover the first end portion EP1 and a second end portion EP2 of the light emitting element LD. Accordingly, the first end portion EP1 and the second end portion EP2 of the light emitting element LD can be exposed, and be respectively connected to the first contact electrode CNE1 and the second contact electrode CNE2.

In case that the second insulating layer INS2 is formed after the light emitting elements LD are completely aligned, the light emitting elements LD can be prevented from being separated from positions at which the light emitting elements LD are aligned.

The second insulating layer INS2 may have a single-layer structure or a multi-layer structure. The second insulating layer INS2 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$). However, the disclosure is not limited to the above-described example.

The first contact electrode CNE1 and the second contact electrode CNE2 may be disposed on the first insulating layer INS1. The first contact electrode CNE1 may be electrically connected to the first end portion EP1 of the light emitting element LD. The second contact electrode CNE2 may be electrically connected to the second end portion EP2 of the light emitting element LD.

The first contact electrode CNE1 may be electrically connected to the first electrode ELT1 through a contact hole penetrating the first insulating layer INS, and the second contact electrode CNE2 may be electrically connected to the second electrode ELT2 through a contact hole penetrating the first insulating layer.

The first contact electrode CNE1 and the second contact electrode CNE2 may include a conductive material. For example, the first contact electrode CNE1 and the second contact electrode CNE2 may include a transparent conductive material including one of Indium Tin Oxide (ITO), Indium Zinc Oxide (IZO), and Indium Tin Zinc Oxide (ITZO). Accordingly, light emitted from the light emitting elements LD can be emitted to the outside of the display device DD while passing through the first and second contact electrodes CNE1 and CNE2. However, the disclosure is not necessarily limited to the above-described example.

In accordance with one or more embodiments, after any one of the first contact electrode CNE1 and the second contact electrode CNE2 may be patterned, the other of the first contact electrode CNE1 and the second contact electrode CNE2 may be patterned. However, the disclosure is not necessarily limited to the above-described example. The first contact electrode CNE1 and the second contact electrode CNE2 may be patterned at the same time through the same process.

The third insulating layer INS4 may be disposed on the second insulating reflective layer 140 and the first contact electrode CNE1. At least a portion of the third insulating layer INS4 may be disposed between the first contact electrode CNE1 and the second contact electrode CNE2, and accordingly, a short-circuit defect between the first contact electrode CNE1 and the second contact electrode CNE2 can be prevented.

The fourth insulating layer INS4 may be disposed on the third insulating layer INS3 and the second contact electrode CNE2. The fourth insulating layer INS4 may protect components of the display element layer DPL from external influence.

Each of the third insulating layer INS3 and the fourth insulating layer INS4 may have a single-layer structure or a multi-layer structure. The third insulating layer INS3 and the fourth insulating layer INS4 may include various kinds of inorganic insulating materials, including silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, and/or titanium oxide $(TiO_x)$.

Components of the pixel PXL including the color conversion layer CCL will be described with reference to FIGS. 7 and 8. FIG. 7 illustrates the color conversion layer CCL, an optical layer OPL, a color filter layer CFL, and the like. For convenience of descriptions, components except the second bank BNK2 in the pixel circuit layer PCL and the display element layer DPL among the above-described components will be omitted in FIG. 7. FIG. 8 may illustrate a stacked structure of the pixel PXL in relation to the color conversion layer CCL, the optical layer OPL, and the color filter layer CFL.

Referring to FIGS. 6 and 7, the second bank BNK2 may be disposed between first to third sub-pixels SPXL1, SPXL2, and SPXL3 or at a boundary of the first to third sub-pixels SPXL1, SPXL2, and SPXL3, and define a space (or area) overlapping with each of the first to third sub-pixels SPXL1, SPXL2, and SPXL3. The space defined by the second bank BNK2 may be an area in which the color conversion layer CCL can be provided.

The color conversion layer CCL may be disposed above light emitting elements LD in the space surrounded by the second bank BNK2. The color conversion layer CCL may include a first color conversion layer CCL1 disposed in the first sub-pixel SPXL1, a second color conversion layer CCL2 disposed in the second sub-pixel SPXL2, and a light scattering layer LSL disposed in the third sub-pixel SPXL3.

The color conversion layer CCL may be disposed above the light emitting element LD. The color conversion layer CCL may change a wavelength of light. In an embodiment, the first to third sub-pixels SPXL1, SPXL2, and SPXL3 may include light emitting elements LD emitting light of the same color. For example, the first to third sub-pixels SPXL1, SPXL2, and SPXL3 may include light emitting elements LD emitting light of a third color (or blue). The color conversion layer CCL including color conversion particles may be disposed on each of the first to third sub-pixels SPXL1, SPXL2, and SPXL3, so that a full-color image can be displayed.

The first color conversion layer CCL1 may include first color conversion particles for converting light of the third color, which may be emitted from the light emitting element LD, into light of a first color. For example, the first color conversion layer CCL1 may include first quantum dots QD1 dispersed in a matrix material such as base resin.

In an embodiment, in case that the light emitting element LD is a blue light emitting element emitting light of blue, and the first sub-pixel SPXL1 is a red pixel, the first color conversion layer CCL1 may include a first quantum dot QD1 for converting light of blue, which may be emitted from the blue light emitting element, into light of red. The first quantum dot QD1 may absorb blue light and emit red light by shifting a wavelength of the blue light according to energy transition. In case that the first sub-pixel SPXL1 is a pixel of another color, the first color conversion layer CCL1 may include a first quantum dot QD1 corresponding to the color of the first sub-pixel SPXL1.

The second color conversion layer CCL2 may include second color conversion particles for converting light of the third color, which may be emitted from the light emitting element LD, into light of a second color. For example, the second color conversion layer CCL2 may include second quantum dots QD2 dispersed in a matrix material such as base resin.

In an embodiment, in case that the light emitting element LD is a blue light emitting element emitting light of blue, and the second sub-pixel SPXL2 is a green pixel, the second color conversion layer CCL2 may include a second quantum dot QD2 for converting light of blue, which may be emitted from the blue light emitting element, into light of green. The second quantum dot QD2 may absorb blue light and emit green light by shifting a wavelength of the blue light according to energy transition. In case that the second sub-pixel SPXL2 is a pixel of another color, the second color conversion layer CCL2 may include a second quantum dot QD2 corresponding to the color of the second sub-pixel SPXL2.

In an embodiment, light of blue having a relatively short wavelength in a visible light band may be incident into the first quantum dot QD1 and the second quantum dot QD2, so that absorption coefficients of the first quantum dot QD1 and the second quantum dot QD2 can be increased. Accordingly, the efficiency of light finally emitted from the first sub-pixel SPXL1 and the second sub-pixel SPXL2 can be improved, and excellent color reproduction can be ensured. The light emitting unit EMU of each of the first to third sub-pixels SPXL1, SPXL2, and SPXL3 may be configured by using light emitting elements of the same color (e.g., blue light emitting elements), so that the manufacturing efficiency of the display device can be improved.

The light scattering layer LSL may be provided to efficiently use light of the third color (or blue) emitted from the light emitting element LD. In an example, in case that the light emitting element LD is a blue light emitting element emitting light of blue, and the third sub-pixel SPXL3 is a blue pixel, the light scattering layer LSL may include at least one kind of light scattering particle SCT to efficiently use light emitted from the light emitting element LD. In an example, the light scattering particle SCT of the light scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide ($ZnO$). The light scattering particle SCT may not disposed only in the third sub-pixel SPXL3, and may be selectively included in the first color conversion layer CCL2 or the second color conversion layer CCL2. In some embodiments, the light scattering particle SCT may be omitted such that the light scattering layer LSL configured with transparent polymer may be provided.

A first capping layer CPL1 may be disposed on the color conversion layer CCL. The first capping layer CPL1 may be provided through the first to third sub-pixels SPXL1, SPXL2, and SPXL3. The first capping layer CPL1 may cover the color conversion layer CCL. The first capping layer CPL1 may prevent the color conversion layer CCL from being damaged or contaminated due to infiltration of an impurity such as moisture or air from the outside.

The first capping layer CPL1 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like, or a combination thereof.

The optical layer OPL may be disposed on the first capping layer CPL1. The optical layer OPL may function to improve light extraction efficiency by recycling light provided from the color conversion layer CCL through total reflection. To this end, the optical layer OPL may have a refractive index relatively lower than a refractive index of the color conversion layer CCL. For example, the refractive index of the color conversion layer may be about 1.6 to about 2.0, and the refractive index of the optical layer OPL may be about 1.1 to about 1.3.

A second capping layer CPL2 may be disposed on the optical layer OPL. The second capping layer CPL2 may be provided throughout the first to third sub-pixels SPXL1, SPXL2, and SPXL3. The second capping layer CPL2 may cover the optical layer OPL. The second capping layer CPL2 may prevent the optical layer OPL from being damaged or contaminated due to infiltration of an impurity such as moisture or air from the outside.

The second capping layer CPL2 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), and the like, or a combination thereof.

A planarization layer PLL may be disposed on the second capping layer CPL2. The planarization layer PLL may be provided throughout the first to third sub-pixels SPXL1, SPXL2, and SPXL3.

The planarization layer PLL may include an organic material such as acrylic resin, epoxy resin, phenolic resin, polyamide resin, polyimide resin, unsaturated polyester resin, poly-phenylene ether resin, poly-phenylene sulfide resin, and/or benzocyclobutene (BCB). However, the disclosure is not necessarily limited thereto, and the planarization layer PLL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The color filter layer CFL may be disposed on the planarization layer PLL. The color filter layer CFL may include color filters CF1, CF2, and CF3 which accord with a color of each pixel PXL. The color filters CF1, CF2, and CF3 which accord with a color of each of the first to third sub-pixels SPXL1, SPXL2, and SPXL3 may be disposed, so that a full-color image can be displayed.

The color filter layer CFL may include a first color filter CF1 disposed in the first sub-pixel SPXL1 to allow light emitted from the first sub-pixel SPXL1 to be selectively transmitted therethrough, a second color filter CF2 disposed in the second sub-pixel SPXL2 to allow light emitted from the second sub-pixel SPXL2 to be selectively transmitted therethrough, and a third color filter CF3 disposed in the third sub-pixel SPXL3 to allow light emitted from the third sub-pixel SPXL3 to be selectively transmitted therethrough.

In an embodiment, the first color filter CF1, the second color filter CF2, and the third color filter CF3 may be respectively a red color filter, a green color filter, and a blue color filter, but the disclosure is not necessarily limited thereto. Hereinafter, when an arbitrary color filter among the first color filter CF1, the second color filter CF2, and the third color filter CF3 may be designated or when two or more kinds of color filters are inclusively designated, the corresponding color filter or the corresponding color filters are referred to as a "color filter CF" or "color filters CF."

The first color filter CF1 may overlap the first color conversion layer CCL1 in the thickness direction of the base layer BSL (e.g., the third direction DR3). The first color filter CF1 may include a color filter material for allowing light of a first color (or red) to be selectively transmitted therethrough. For example, in case that the first sub-pixel SPXL1 is a red pixel, the first color filter CF1 may include a red color filter material.

The second color filter CF2 may overlap the second color conversion layer CCL2 in the thickness direction of the base layer BSL (e.g., the third direction DR3). The second color filter CF2 may include a color filter material for allowing light of a second color (or green) to be selectively transmitted therethrough. For example, in case that the second sub-pixel SPXL2 is a green pixel, the second color filter CF2 may include a green color filter material.

The third color filter CF3 may overlap the light scattering layer LSL in the thickness direction of the base layer BSL (e.g., the third direction DR3). The third color filter CF3 may include a color filter material for allowing light of a third color (or blue) to be selectively transmitted therethrough. For example, in case that the third sub-pixel SPXL3 is a blue pixel, the third color filter CF3 may include a blue color filter material.

In some embodiments, a light blocking layer BM may be further disposed between the first to third color filters CF1, CF2, and CF3. As described above, in case that the light blocking layer BM is formed between the first to third color filters CF1, CF2, and CF3, a color mixture defect viewed at the front or side of the display device DD can be prevented. The material of the light blocking layer BM is not particularly limited, and the light blocking layer BM may be configured with various light blocking materials. In an example, the light blocking layer BM may be implemented by stacking the first to third color filters CF1, CF2, and CF3.

An overcoat layer OC may be disposed on the color filter layer CFL. The overcoat layer OC may be provided throughout the first to third sub-pixels SPXL1, SPXL2, and SPXL3. The overcoat layer OC may cover a lower member including the color filter layer CFL. The overcoat layer OC may prevent moisture or air from infiltrating into the above-described lower member. Also, the overcoat layer OC may protect the above-described lower member from a foreign matter such as dust.

The overcoat layer OC may include an organic material such as acrylic resin, epoxy resin, phenolic resin, polyamide resin, polyimide resin, unsaturated polyester resin, poly-phenylene ether resin, poly-phenylene sulfide resin, and/or benzocyclobutene (BCB). However, the disclosure is not necessarily limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The outer film layer OFL may be disposed on the overcoat layer OC. The outer film layer OFL may be disposed at an outer portion of the display device DD, to reduce external influence. The outer film layer OFL may be provided throughout the first to third sub-pixels SPXL1, SPXL2, and SPXL3. In some embodiments, the outer film layer OFL may include at least one of a polyethylenephthalate (PET) film, a low reflective film, a polarizing film, and a transmittance controllable film, but the disclosure is not necessarily limited thereto. In some embodiments, the pixel PXL may include an upper substrate instead of the outer film layer OFL.

Hereinafter, pads PAD in accordance with embodiments of the disclosure will be described with reference to FIGS. 9 to 17. For example, structures of the pads PAD in accordance with first to fourth embodiments of the disclosure are illustrated in FIGS. 9 to 17. For convenience of description, a pad area PDA for describing the first to fourth embodiments of the disclosure may be specified based on a schematic enlarge view of area EA1 shown in FIG. 4. In FIGS. 9 to 17, descriptions of portions overlapping with those described above will be simplified or will not be repeated.

Figure 9:
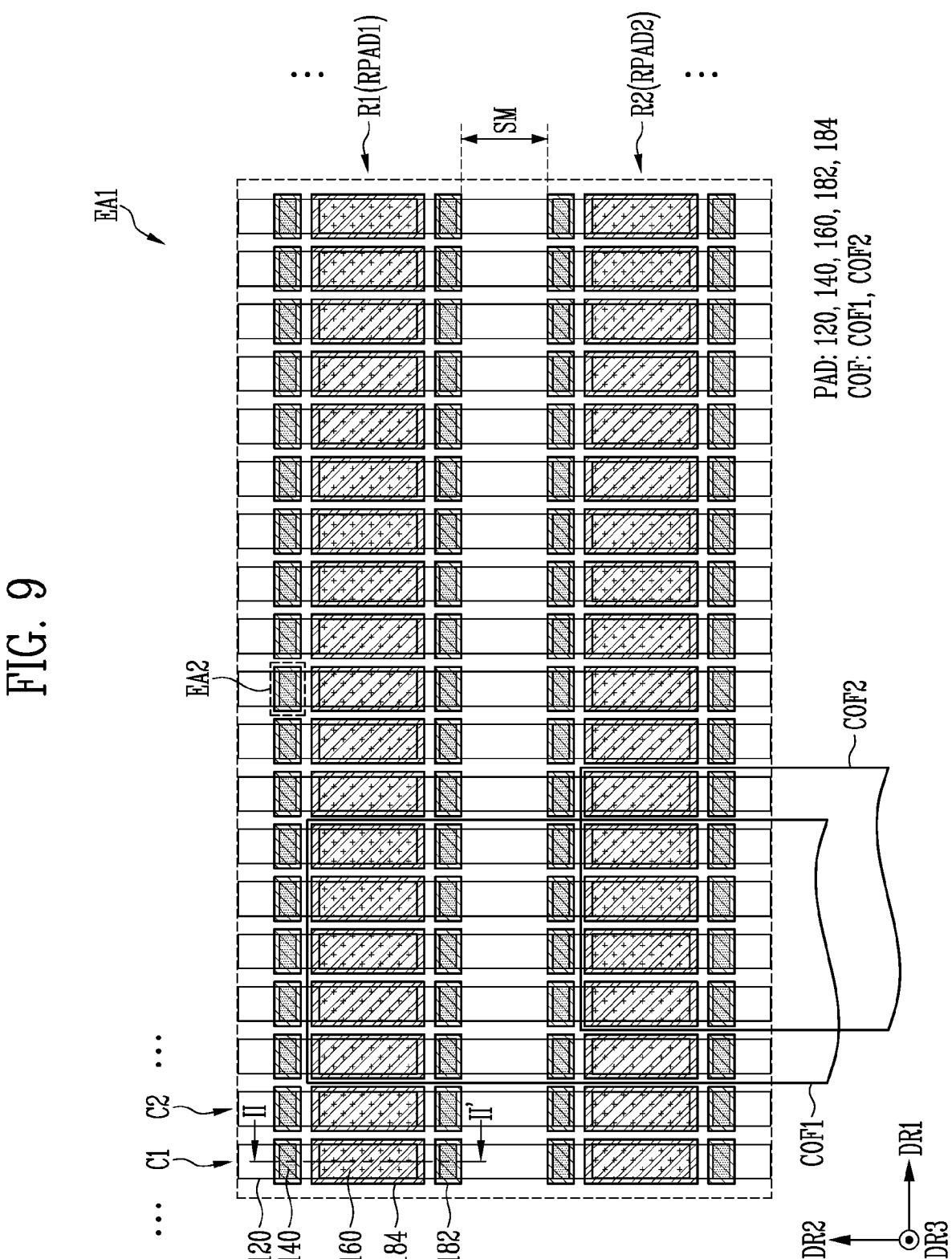
FIG. 9 is a schematic enlarged view of area EA1 shown in FIG. 4.
Figure 10:
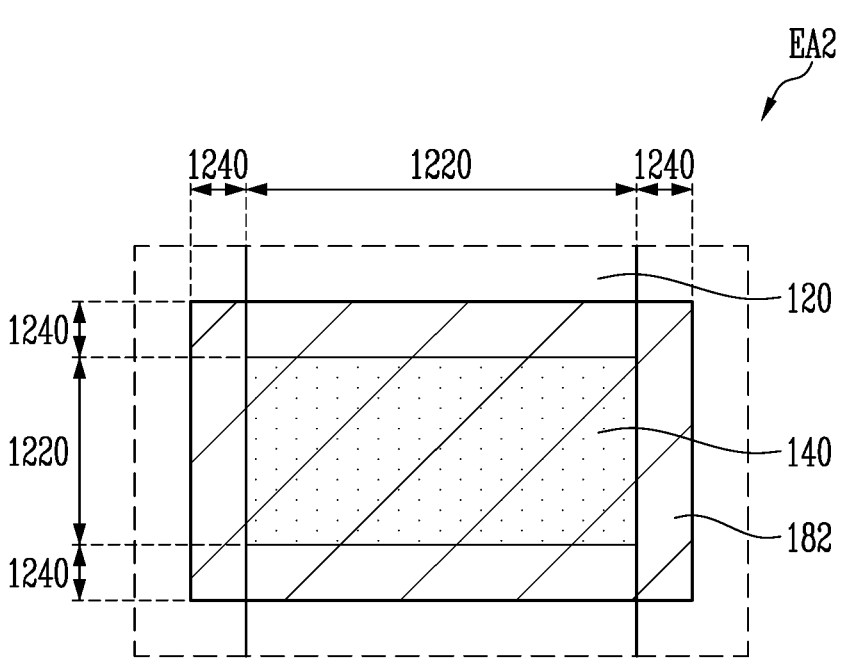
FIG. 10 is a schematic enlarged view of area EA2 shown in FIG. 9.
Figure 11:
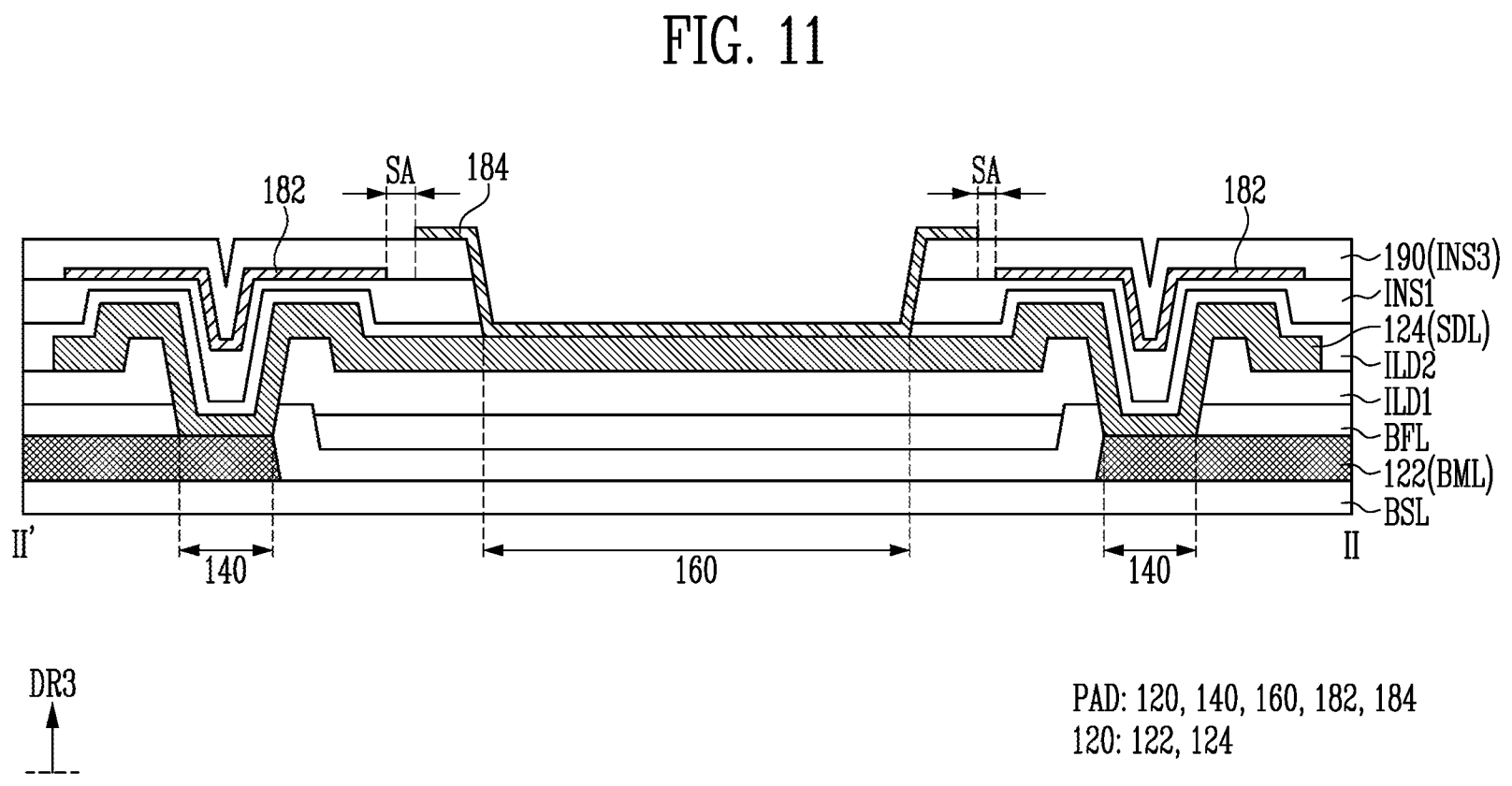
Figure 12:
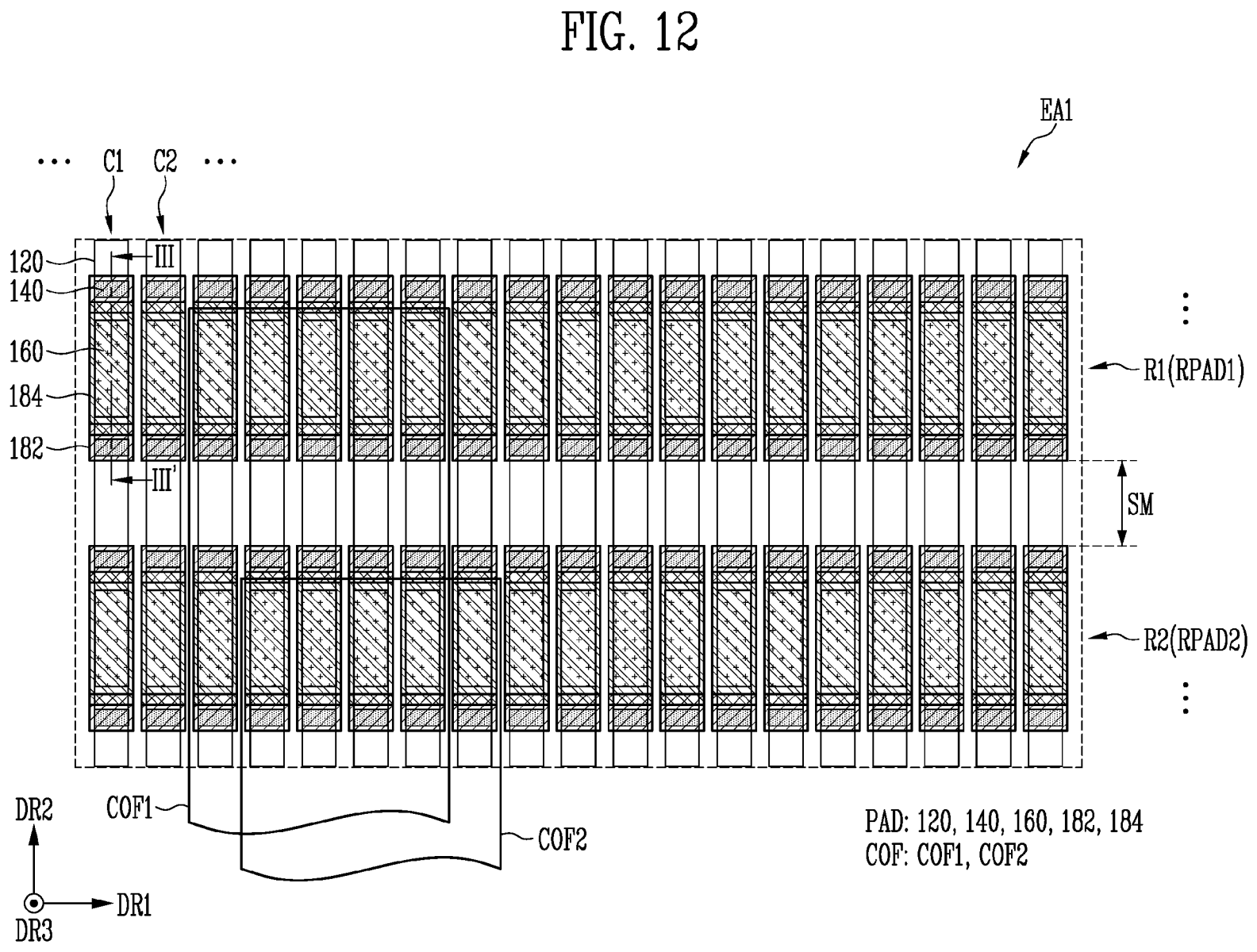
Figure 13:
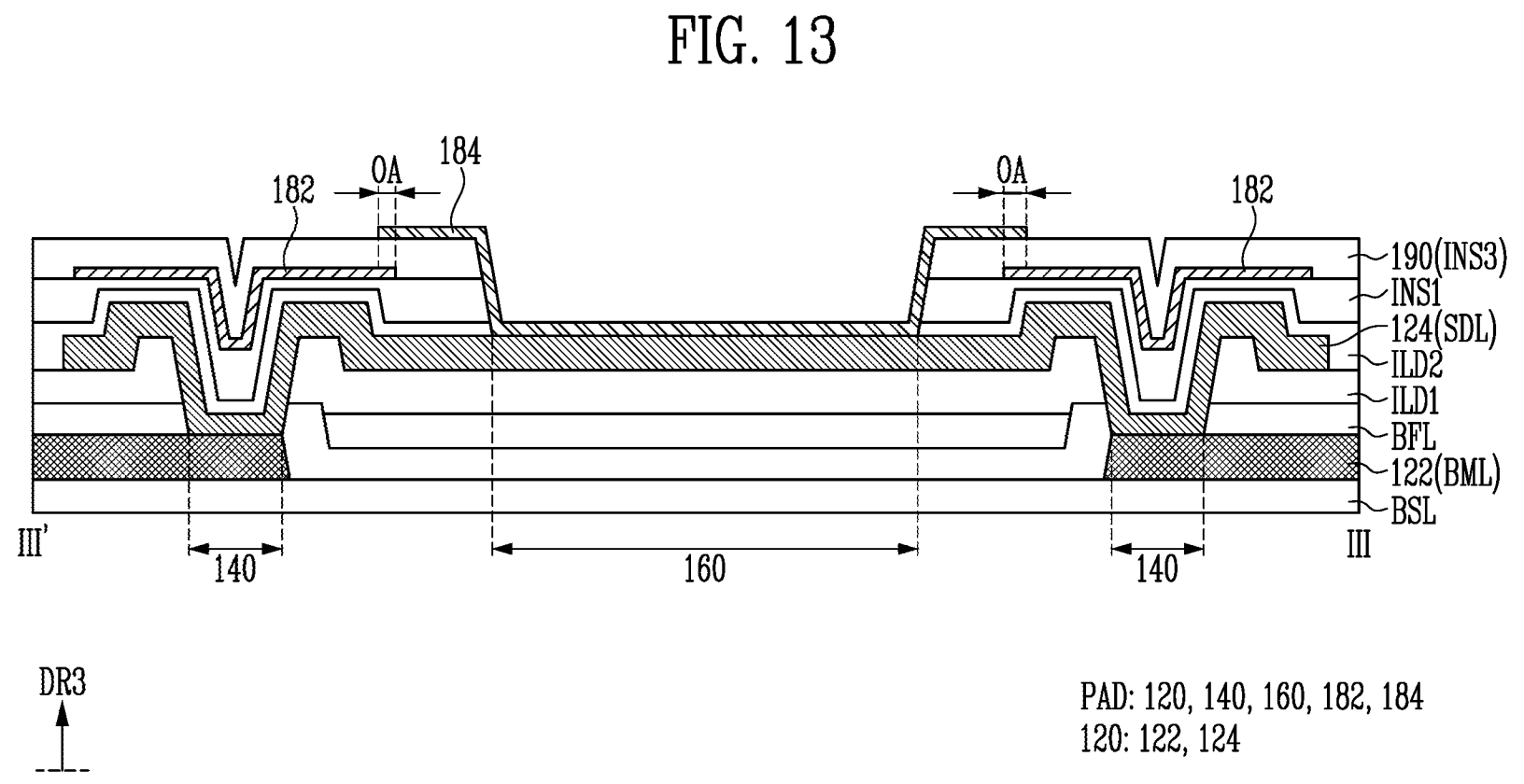
Figure 14:
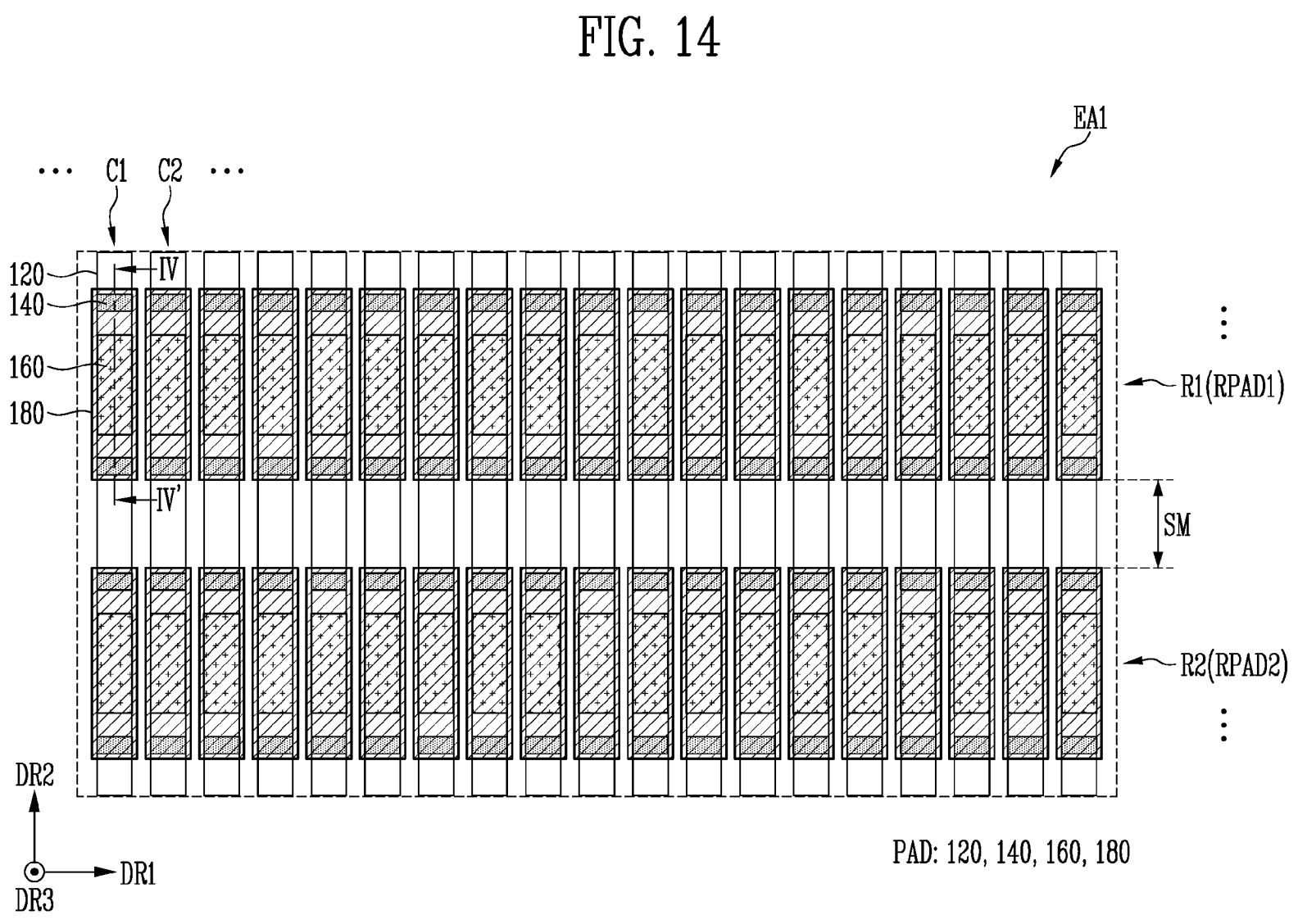
Figure 15:
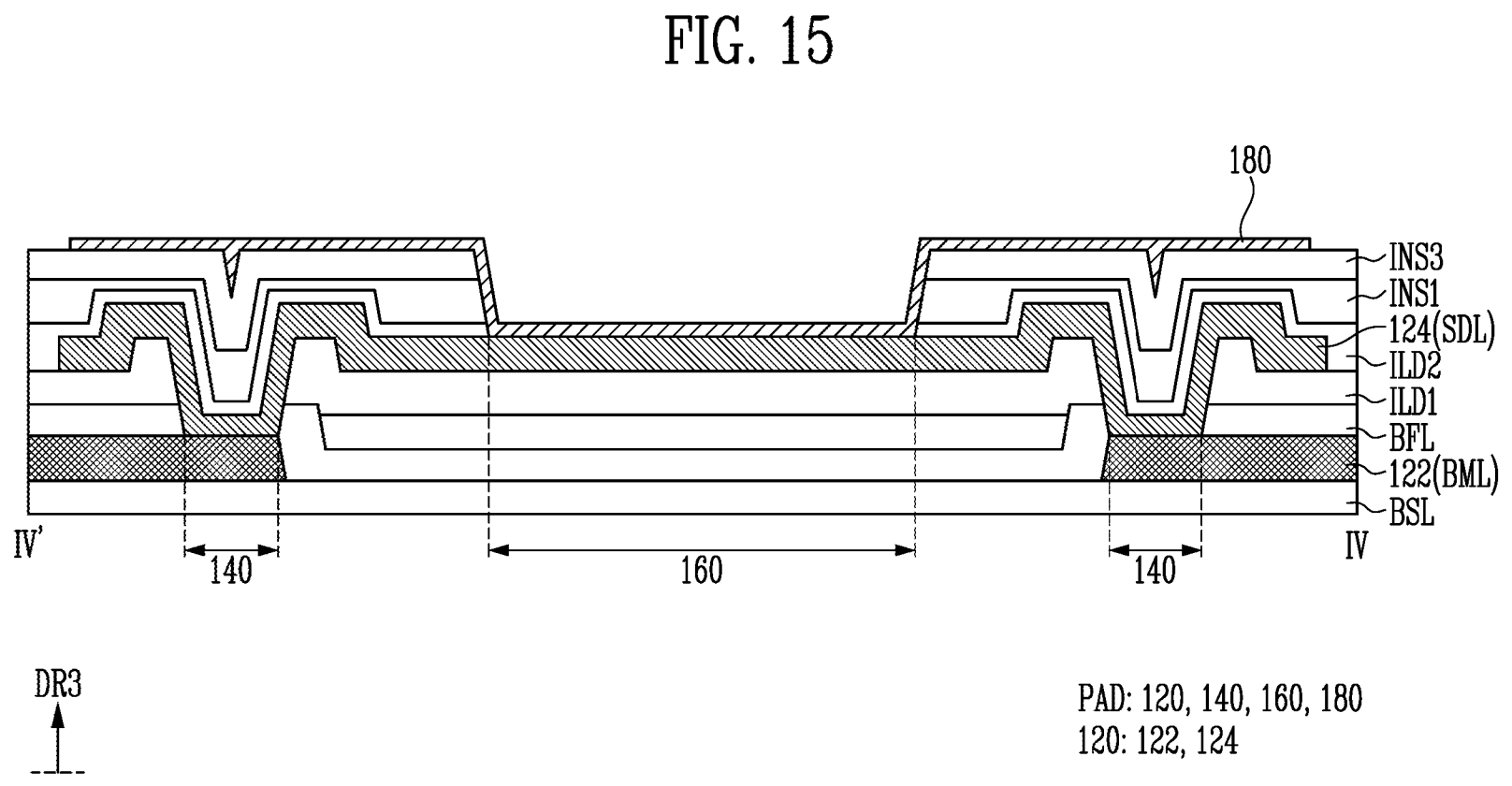
Figure 16:
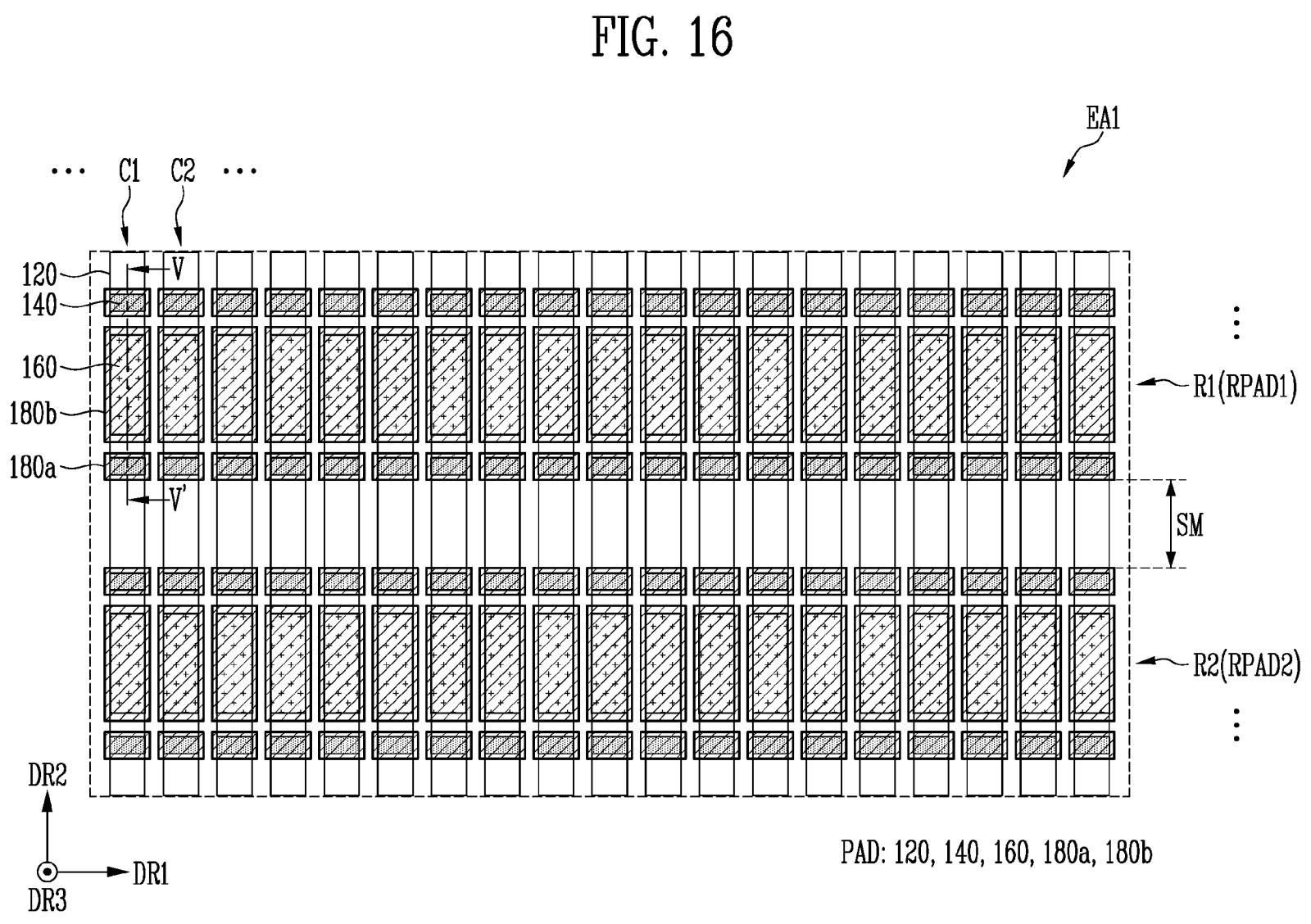
Figure 17:
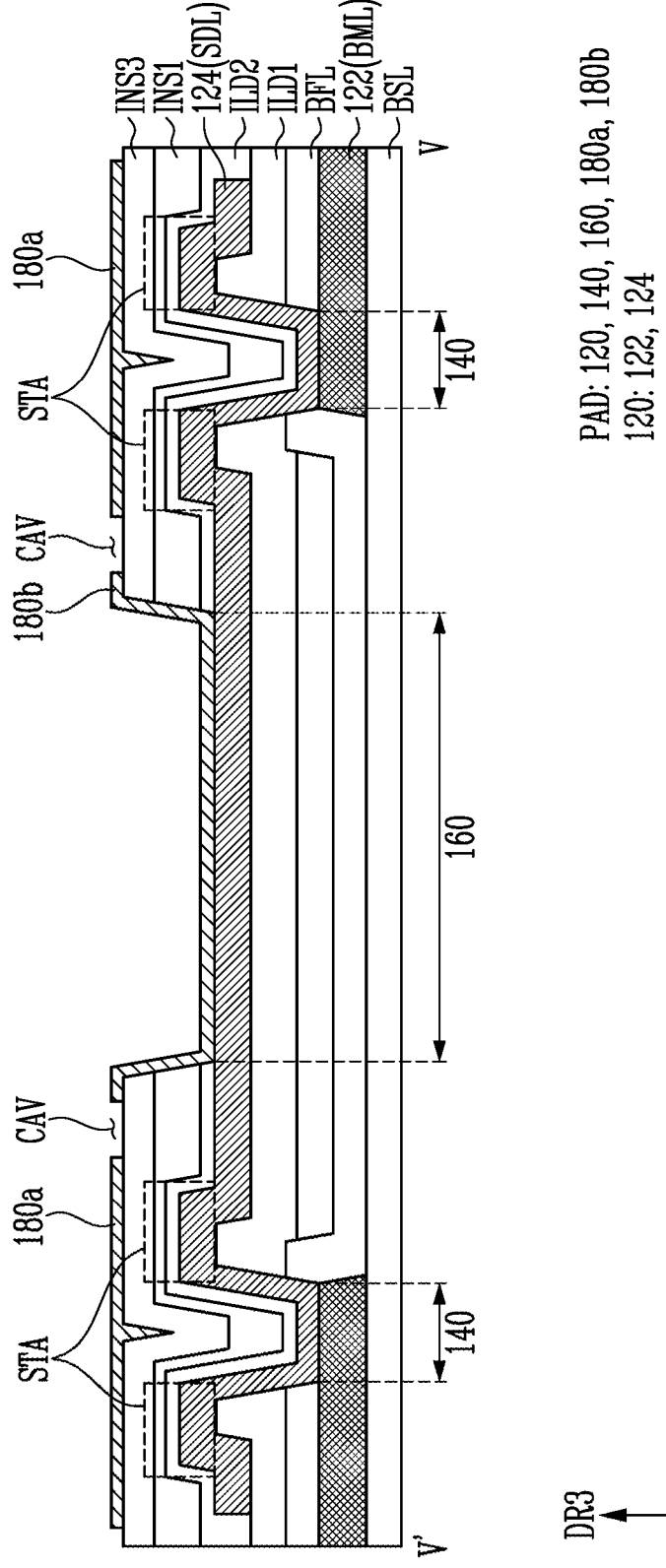
FIG. 17 is a schematic sectional view taken along line V-V' shown in FIG. 16.

FIGS. 9 to 11 are schematic views illustrating a structure of a pad in accordance with a first embodiment of the disclosure. FIGS. 12 and 13 are schematic views illustrating a structure of a pad in accordance with a second embodiment of the disclosure. FIGS. 14 and 15 are schematic views illustrating a structure of a pad in accordance with a third embodiment of the disclosure. FIGS. 16 and 17 are schematic views illustrating a structure of a pad in accordance with a fourth embodiment of the disclosure.

As described above, the pad PAD in accordance with the embodiment of the disclosure may be a component for providing an electrical signal to be applied to the pixel PXL. For example, the pad PAD may be a path through which an electrical signal (e.g., a scan signal and a data signal) provided from the driving circuit member DCB may be moved. Accordingly, in order for the pixel PXL to be normally driven, the reliability of the electrical signal may be improved, and it may be necessary to reduce noise with respect to the electrical signal. To this end, it may be necessary to prevent damage of the pad PAD. In case that the pad PAD is exposed to the outside in a process of performing procedures, there may exist a risk that the pad PAD will be damaged. In accordance with one or more embodiments, a structure may be provided, in which the risk that the pad PAD will be damaged can be prevented. This will be described in detail later, based on the first to fourth embodiments of the disclosure.

First, a structure of a pad PAD in accordance with a first embodiment of the disclosure will be described with reference to FIGS. 9 to 11. FIG. 9 is a schematic enlarged view of the area EA1 shown in FIG. 4. FIG. 10 is a schematic enlarged view of area EA2 shown in FIG. 9. FIG. 11 is a schematic sectional view taken along line II-II' shown in FIG. 9. In FIG. 11, a pad line 120 may be expressed with hatching. However, in FIG. 9, the hatching of the pad line 120 is omitted such that the drawing can be clearly illustrated.

In FIG. 9, a planar structure of pads PAD is illustrated as one area in the pad area PDA.

The pads PAD may be arranged in a matrix form with respect to a row direction according to the first direction DR1 and a column direction according to the second direction DR2.

For example, multiple pads PAD may be provided, to be arranged along the first direction DR1. For example, the pads PAD may be sequentially disposed along the row direction according to the first direction DR1. The pads PAD may be spaced apart from each other in the first direction DR1. For example, some (e.g., a subset) of the pads PAD may be arranged on a first column C1, and others of the pads PAD may be arranged on a second column C2. The first column C1 and the second column C2 may be spaced apart from each other along the first direction DR1.

For example, multiple pads PAD may be provided, to be arranged along the second direction DR2. For example, the pads PAD may be sequentially disposed along the column direction according to the second direction DR2. The pads PAD may be spaced apart from each other in the second direction DR2. For example, some of the pads PDA may be arranged on a first row R1, and other some of the pads PAD may be arranged on a second row R2. The first row R1 and the second row R2 may be spaced apart from each other along the second direction DR2.

Pads PAD corresponding rows adjacent to each other in the second direction DR2 may be spaced (or separated) from each other at a separation distance SM. For example, as pads PAD disposed on the same column, one end of a pad PAD (e.g., first row pads RPAD1) disposed on the first row R1 and one end of a pad PAD (e.g., second row pads RPAD2) disposed on the second row R2 may be spaced apart from each other at the separation distance SM. In accordance with one or more embodiments, the separation distance SM may be about 500 µm or less. In other embodiments, the separation distance SM may be about 450 µm or less. In accordance with one or more embodiments, in the pad PAD in accordance with the first embodiment of the disclosure, any risk of a short-circuit defect between electrodes does not occur even in case that the separation distance SM may be sufficiently small. This will be described later.

First contact areas 140 of pads PAD adjacent to each other in a direction (e.g., the column direction as the second direction DR2) may be adjacent to each other with an area defining the separation distance SM, which may be interposed therebetween. For example, a first contact area 140 of the first row pads RPAD1 and a first contact area 140 of the second row pads RPAD2 may be adjacent to each other with an area between the first row pads RPAD1 and the second row pads RPAD2, which may be interposed therebetween.

The pad PAD may include at least a portion of the pad line 120, i.e., a first electrode part 182 and the second electrode part 184. The pad PAD may include the first contact area 140 and a second contact area 160. For example, the pad PAD may include the first electrode part 182 and the second electrode part 184, and include a portion of the pad line 120, which corresponds to the first contact area 140 and the second contact area 160. A detailed structure of the pad PAD will be described in conjunction with FIGS. 10 and 11.

The pad line 120 may be disposed on the base layer BSL. The pad line 120 may extend in a direction (e.g., the second direction DR2). The pad line 120 may extend in the column direction. Accordingly, the pad line 120 may electrically connect pads PAD adjacent to each other in the column direction (e.g., the second direction DR2). In some embodiments, the pad line 120 may include multiple lines. For example, the pad line 120 may include a first pad line 122 and a second pad line 124. An electrical signal provided through the second pad line 124 may pass through the first pad line 122. The first pad line 122 may be disposed on the base layer BSL, and be covered by the buffer layer BFL. The second pad line 124 may be disposed on the first interlayer insulating layer ILD1, and be covered by the second interlayer insulating layer ILD2. At least a portion of the second pad line 124 may cover a side surface of the buffer layer BFL.

The first pad line 122 and the second pad line 124 may be disposed in different layers. For example, the first pad line 122 and the second pad line 124 may be patterned through different processes. The first pad line 122 and the second pad line 124 may be metal lines patterned (e.g., a photoresist process) by using different masks. For example, the first pad line 122 may be formed with the above-described lower auxiliary electrode BML through the same process. The second pad line 124 may be formed with the described-above source/drain layer SDL through the same process.

The first contact area 140 may mean an area (or structure) in which a portion of the pad line 120 disposed in a layer and another portion of the pad line 120 disposed in another layer are electrically connected to each other. In accordance with one or more embodiments, the first pad line 122 and the second pad line 124 may overlap the first contact area 140 in a plan view. The first contact area 140 may be an area (or structure) in which the first pad line 122 and the second pad line 124 are electrically connected to each other. In some embodiments, the first contact area 140 may be an area (or structure) in which the first pad line 122 and the second pad line 124 are in contact with each other.

In order to form the first contact area 140, the buffer layer BFL and the first interlayer insulating layer ILD1 may form an opening in the first contact area 140. For example, the first pad line 122 may be opened (or exposed) by the buffer layer BFL and the first interlayer insulating layer ILD1 in the first contact area 140. The second pad line 124 patterned after the buffer layer BFL and the first interlayer insulating layer ILD1 are formed may be electrically connected to the first pad line 122 through the formed opening.

The first contact area 140 may overlap the pad line 120 and the first electrode part 182 in a plan view. For example, the first contact area 140 disposed at a side of the second contact area 160 may overlap the pad line 120 and the first electrode part 182 disposed at a side of the second contact area 160 in a plan view. The first contact 140 may overlap the first pad line 122, the second pad line 124, and the first electrode part 182 in a plan view.

The second contact area 160 may mean an area (or structure) in which a portion of the pad line 120 disposed in a layer and the second electrode part 184 are electrically connected to each other. In accordance with one or more embodiments, the second pad line 124 and the second electrode part 184 may overlap the second contact area 160 in a plan view. The second contact area 160 may be an area (or structure) in which the second pad line 124 and the second electrode part 184 may be electrically connected to each other. In some embodiments, the second contact area 160 may be an area (or structure) in which the second pad line 124 and the second electrode part 184 are in contact with each other.

In order to form the second contact area 160, the second interlayer insulating layer ILD2 and the first insulating layer INS1, which are disposed over the second pad line 124, may form an opening in the second contact area 160. For example, the second pad line 124 may be opened by the second interlayer insulating layer ILD2 and the first insulating layer INS1 in the second contact area 160. The second electrode part 184 patterned after the second interlayer insulating layer ILD2 and the first insulating layer INS1 are formed may be electrically connected to the second pad line 124 through the formed opening.

In accordance with one or more embodiments, the chip on film COF (not shown in FIG. 11) may be electrically connected to the second electrode part 184. For example, the chip on film COF may be electrically connected to the second electrode part 184 by an anisotropy-conductive film (not shown). An electrical signal provided from the driving circuit member DCB may be applied (or provided) to the second electrode part 184 and the second pad line 124. In some embodiments, the applied electrical signal may be applied (or provided) to the first pad line 122 in the first contact area 140, and be moved along the formed path of the pad line 120.

The first electrode part 182 may be disposed on the first insulating layer INS1. The first electrode part 182 may be covered by a pad insulating pattern 190. In some embodiments, the first electrode part 182 may overlap the first pad line 122 and the second pad line 124 in a plan view.

The first electrode part 182 may be patterned through the same process as the above-described first contact electrode CNE1. The first electrode part 182 may be formed (or deposited) at the same time as the first contact electrode CNE1, to include the same material as the first contact electrode CNE1.

The first electrode part 182 may overlap the second interlayer insulating layer ILD2 and the first insulating layer INS1 in a plan view. The first electrode part 182 may cover the second interlayer insulating layer ILD2 and the first insulating layer INS1. In some embodiments, the first electrode part 182 may be in contact with one of the second interlayer insulating layer ILD2 and the first insulating layer INS1.

In accordance with one or more embodiments, the first electrode part 182 may be disposed on an insulating layer disposed on the pad line 120 (e.g., the second pad line 124) in the first contact area 140, so that damage of lines in the first contact area 140 may be prevented. Accordingly, the reliability of an electrical signal passing through the pads PAD can be substantially improved. For example, insulating layers (e.g., the second interlayer insulating layer ILD2 and the first insulating layer INS1) disposed on the second pad line 124 may be removed by a process environment while subsequent processes may be performed. In the first contact area 140, the second pad line 124 may be exposed to the outside, and there may occur a risk that the second pad line 124 will be damaged (e.g., corroded). However, in accordance with one or more embodiments, the first electrode part 182 may cover insulating layers disposed on the second pad line 124 in the first contact area 140, thereby substantially preventing the insulating layers from being removed through a subsequent process. Accordingly, the second pad line 124 may not be exposed to the outside, and consequently, the reliability of an electrical signal applied to the pads PAD can be improved.

Besides, the first electrode part 182 may be patterned through the same process as components disposed in the display area DA, so that any additional mask may not be used. In other words, any additional process is not performed, and thus process cost can be saved.

In accordance with one or more embodiments, the first electrode part 182 may entirely cover the first contact area 140. For example, referring to FIG. 10, the first contact part 182 may overlap the first contact area 140 in a plan view, and at least a portion of the first contact part 182 may not overlap the first contact area 140. The first contact area 140 may entirely overlap the first electrode part 182 in a plan view. For example, the first electrode part 182 may include an overlapping area 1220 and a non-overlapping area 1240. The first electrode part 182 may overlap the contact area 140 in the overlapping area 1220. The first electrode part 182 may not overlap the first contact area 140 in the non-overlapping area 1240. As described above, the first electrode part 182 can more effectively protect lines in the first contact area 140.

The second electrode par 184 may be disposed on the pad insulating pattern 190. The second electrode part 184 may cover side surfaces of the pad insulating pattern 190 and the first insulating layer INS1. In some embodiments, the second electrode part 184 may overlap the second pad line 124 in a plan view.

The second electrode part 184 may be electrically connected to the second pad line 124 in the second contact area 160. The second electrode part 184 may be electrically connected to the driving circuit member DCB.

The second electrode part 184 may be patterned through the same process as the above-described second contact electrode CNE2. The second contact part 184 may be formed (or deposited) at the same time as the second contact electrode CNE2, to include the same material as the second contact electrode CNE2.

The second electrode part 184 may be spaced apart from the first electrode part 182 in a plan view. For example, the second electrode part 184 and the first electrode part 182 may be separated from each other with a separation area SA interposed therebetween. For example, in some embodiments, the first electrode part 182 and the second electrode part 184 may not overlap each other in a plan view.

The pad insulating pattern 190 may be disposed on the first insulating layer INS1. The pad insulating pattern 190 may cover the first electrode part 182. The pad insulating pattern 190 may be covered by the second electrode part 184. The pad insulating pattern 190 may be patterned through the same process as the above-described third insulating layer INS3. The pad insulating pattern 190 may be formed (or deposited) at the same time as the third insulating layer INS3, to include the same material as the third insulating layer INS3.

The first electrode part 182 and the second electrode part 184 may be electrically separated from each other with the pad insulating pattern 190 interposed therebetween. For example, the pad insulating pattern 190 may allow the first electrode part 182 and the second electrode part 184 to be physically spaced apart from each other. The pad insulating pattern 190 may allow contact between the first electrode part 182 and the second electrode part 184 to be avoided. In accordance with one or more embodiments, the pad insulating pattern 190 may separate the first electrode part 182 and the second electrode part 184 from each other, thereby substantially preventing a short-circuit defect which may occur in the pad area PDA.

For example, in conjunction with FIG. 9, the pads PAD of the first row R1 and the pads PAD of the second row R2, which are adjacent to each other, may be spaced apart from each other at the separation distance SM. In order to manufacture the display device DD, the chip on film COF may be electrically connected to the first row pads RPAD1 as the pads PAD of the first row R1 and the second row pads RPAD2 as the pads PAD of the second row R2. For example, the chip on film COF may include a first chip on film COF1 and a second chip on film COF2. The first chip on film COF1 may be electrically connected to at least some of the first row pads RPAD1, and the second chip on film COF2 may be electrically connected to at least some of the second row pads RPAD2. It may be necessary for the first chip on film COF1 and the second chip on film COF2 to be electrically separated from each other. In order to prevent a short-circuit defect between the first chip on film COF1 and the second chip on film COF2, a margin of the separation distance SM in a process may be secured. However, as the structure of the display device DD may be advanced, multiple lines are to be disposed in a narrow area, and hence the separation distance SM may be decreased. However, in case that the separation distance SM is excessively decreased, a risk that a short circuit will occur between the first chip on film COF1 and the second chip on film COF2 may be increased. In particular, in case that the first electrode part 182 for covering the first contact area 140 is formed, it may be difficult to sufficiently secure the separation distance SM.

However, in accordance with one or more embodiments, the second electrode part 184 configured such that the first electrode part 182 covering the first contact area 140 receives an electrical signal in the second contact area 160 may be clearly separated by the pad insulating pattern 190. Although the first electrode part 182 protecting lines in the first contact area 140 may be disposed, the above-described structure may be construed as that an electrode component does not extend from the viewpoint of a short-circuit risk. Consequently, in accordance with the embodiment of the disclosure, a short-circuit defect between chip on films COF disposed adjacent to each other to be connected to different pads PAD while protecting lines of the first contact area 140 can be prevented.

Besides, as described above, the first electrode part 182, the second electrode part 184, and the pad insulating pattern 190 may be patterned through the same process as respective layers disposed in the display area DA, and hence processes can be simplified.

A structure of a pad PAD in accordance with a second embodiment of the disclosure will be described with reference to FIGS. 12 and 13. In the pad PAD in accordance with the second embodiment of the disclosure, portions different from those of the pad PAD in accordance with the first embodiment of the disclosure will be described. In FIGS. 12 and 13, descriptions of portions overlapping with those described above will be simplified or will not be repeated.

FIG. 12 is a schematic enlarged view of the area EA1 shown in FIG. 4. FIG. 13 is a schematic sectional view taken along line III-III' shown in FIG. 12. In FIG. 13, the pad line 120 is expressed with hatching. However, in FIG. 12, the hatching of the pad line 120 may be omitted such that the drawing can be clearly illustrated. In FIG. 12, a planar structure of pads PAD is illustrated as one area in the pad area PDA.

The pad PAD in accordance with the second embodiment of the disclosure may be different from the pad PAD in accordance with the first embodiment of the disclosure, at least in that the first electrode part 182 and the second electrode part 184 may overlap each other.

For example, the first electrode part 182 and the second electrode part 184 may overlap each other in an electrode overlapping area OA in a plan view. The first electrode part 182 and the second electrode part 184 may form the electrode overlapping area OA. While the first electrode part 182 and the second electrode part 184 are separated from each other by the pad insulating pattern 190, the first electrode part 182 and the second electrode part 184 may overlap each other in a plan view. Accordingly, the first electrode part 182 and the second electrode part 184 can be further adjacent to each other.

In accordance with one or more embodiments, as the first electrode part 182 and the second electrode part 184 are further adjacent to each other, the display device DD can be manufactured such that the separation distance may be further increased, and a process margin for attaching the chip on film COF can be further secured. Accordingly, a short-circuit defect between the first chip on film COF1 for the pad PAD of the first row R1 and the second chip on film for the pad PAD of the second row R2 can be further prevented.

A structure of a pad PAD in accordance with a third embodiment of the disclosure will be described with reference to FIGS. 14 and 15. In the pad PAD in accordance with the third embodiment of the disclosure, portions different from those of the pads PAD in accordance with the first and second embodiments of the disclosure will be described. In FIGS. 14 and 15, descriptions of portions overlapping with those described above will be simplified or will not be repeated.

FIG. 14 is a schematic enlarged view of the area EA1 shown in FIG. 4. FIG. 15 is a schematic sectional view taken along line IV-IV' shown in FIG. 14. In FIG. 15, the pad line 120 is expressed with hatching. However, in FIG. 14, the hatching of the pad line 120 may be omitted such that the drawing can be clearly illustrated. In FIG. 14, a planar structure of pads PAD is illustrated as one area in the pad area PDA.

The pad PAD in accordance with the third embodiment of the disclosure may be different from the pads PAD in accordance with the first and second embodiments of the disclosure, at least in that an electrode part 180 is provided instead of the first electrode part 182 and the second electrode part 184.

For example, the electrode part 180 may be disposed throughout the first contact area 140 and the second contact area 160. In some embodiments, the electrode part 180 may include a first overlapping area overlapping the first contact area 140 and a second overlapping area overlapping the second contact area 160, in a plan view. In some embodiments, in the first contact area 140, the second interlayer insulating layer ILD2, the first insulating layer INS1, the third insulating layer INS3, and at least a portion of the electrode part 180 may be disposed on the second pad line 124. In the second contact area 160, at least another portion of the electrode part 180 may be disposed on the second pad line 124.

In accordance with one or more embodiments, the electrode part 180 may include an electrode which may be disposed in the first contact area 140 and may be disposed on insulating layers (e.g., the second interlayer insulating layer ILD2 and the first insulating layer INS1) covering the second pad line 124, and an electrode electrically connected to the second pad line 124 in the second contact area 160.

Thus, processes are simplified, and accordingly, the convenience of processes can be enhanced.

A structure of a pad PAD in accordance with a fourth embodiment of the disclosure will be described with reference to FIGS. 16 and 17. In the pad PAD in accordance with the fourth embodiment of the disclosure, portions different from those of the pads PAD in accordance with the first to third embodiments of the disclosure will be described. In FIGS. 16 and 17, descriptions of portions overlapping with those described above will be simplified or will not be repeated.

FIG. 16 is a schematic enlarged view of the area EA1 shown in FIG. 4. FIG. 17 is a schematic sectional view taken along line V-V' shown in FIG. 16. In FIG. 17, the pad line 120 is expressed with hatching. However, in FIG. 16, the hatching of the pad line 120 may be omitted such that the drawing can be clearly illustrated. In FIG. 16, a planar structure of pads PAD is illustrated as one area in the pad area PDA.

The pad PAD in accordance with the fourth embodiment of the disclosure may be different from the pads PAD in accordance with the first to third embodiments of the disclosure, at least in that a connection electrode part 180*b* and an isolation electrode part 180*a*, which may be disposed on the third insulating layer INS3, may be spaced apart from each other.

Similarly to the electrode part 180 of the third embodiment of the disclosure, the connection electrode part 180*b* and the isolation electrode part 180*a* may be patterned through the same process. However, in accordance with one or more embodiments, the connection electrode part 180*b* and the isolation electrode part 180*a* may be disposed to be spaced apart from each other, so that a cavity CAV may be formed. For example, the cavity CAV may be formed between the connection electrode part 180*b* and the isolation electrode part 180*a*, and the connection electrode part 180*b* and the isolation electrode part 180*a* may be electrically separated from each other with the cavity CAV interposed therebetween. In some embodiments, the isolation electrode part 180*a* may be electrically isolated.

The isolation electrode part 180*a* may cover the first contact area 140. In a plan view, the isolation electrode part 180*a* may be disposed on insulating layers (e.g., the second interlayer insulating layer ILD2, the first insulating layer INS1, and the third insulating layer INS3) covering the second pad line 124 in the first contact area 140.

In accordance with one or more embodiments, the isolation electrode part 180*a* may cover the second pad line 124 adjacent to the first contact area 140. The isolation electrode part 180*a* may overlap a step difference area STA in a plan view. The cavity CAV may not overlap the step difference area STA in a plan view. The step difference area STA may be an area in which a step difference may be formed, as compared with an adjacent area. The step difference area STA may be formed as lines (e.g., the first pad line 122 and the second pad line 124) are stacked adjacent to the first contact area 140.

A thickness of an insulating layer (e.g., the second interlayer insulating layer ILD2 and the first insulating layer INS1) formed on the second pad line 124 in the step difference area STA may be thinner than a thickness of an insulating layer in another adjacent area. Experimentally, lines overlapping with the step difference area STA may not be appropriately protected.

However, in accordance with one or more embodiments, the isolation electrode part 180*a* may overlap the step difference area STA. Thus, the insulating layers (e.g., second interlayer insulating layer ILD2 and the first insulating layer INS1) disposed in the step difference area STA to be formed relatively thin while overlapping with the second pad line 124 can be protected. Accordingly, damage of lines (e.g., the second pad line 124) in the step difference area STA can be substantially prevented.

Particularly, in accordance with one or more embodiments, the isolation electrode part 180a and the connection electrode part 180b may be patterned to form the cavity CAV. To this end, an etching process may be performed in an area corresponding to the cavity CAV. In the etching process, a photoresist layer may be formed relatively thin in the area corresponding to the cavity CAV, and accordingly, the area corresponding to the cavity CAV may be relatively largely influenced by the etching process. For example, experimentally, in case that the cavity CAV overlaps with the step difference area STA, there may occur a risk that the insulating layers formed relatively thin in the step difference area STA will be removed. However, in accordance with one or more embodiments, the area in which the cavity CAV may be disposed may be different from the step difference area STA, and the influence of the etching process in the area corresponding to the cavity CAV may be applied to a relative thick insulating layer. Consequently, the position of the cavity CAV may be defined to be different from the step difference area STA, so that damage of lines disposed in (or overlapping with) the step difference area can be substantially prevented.

The connection electrode part 180b may cover the second contact area 160. The connection electrode part 180b may overlap the second pad line 124 in a plan view, and be electrically connected to the second pad line 124.

In accordance with one or more embodiments, the connection electrode part 180b electrically connected to the chip on film COF may be electrically separated from the isolation electrode part 180a covering the first contact area 140. After a process of attaching the chip on film COF or after the chip on film COF may be attached, a short-circuit defect between the pad PAD of the first row R1 and the pad PAD of the second row R2 can be prevented.

In accordance with the disclosure, there can be provided a display device in which a short-circuit defect in a pad area can be substantially prevented, and damage of a line (or electrode) can be substantially prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the features and scope of the disclosure.

What is claimed is:

1. A display device including a display area and a pad area, the display device comprising:
    a pixel on a base layer in the display area, the pixel including a light-emitting element; and
    pads on the base layer in the pad area, the pads including:
        pad lines including a first pad line and a second pad line;
        a first electrode part; and a second electrode part,
    wherein the pads include a first contact area and a second contact area,
    wherein the first pad line and the second pad line are electrically connected to each other in the first contact area,
    wherein the second pad line and the second electrode part are electrically connected in the second contact area,
    wherein the first electrode part overlaps the second pad line in a plan view, and
    wherein the first electrode part and the second electrode part are electrically separated from each other by a pad insulating pattern.

2. The display device of claim 1, wherein the first electrode part covers an insulating layer, the insulating layer being on the second pad line in the first contact area.

3. The display device of claim 2, wherein in the first contact area, the first pad line, the second pad line, the insulating layer, and the first electrode part overlap each other in plan view, and
    wherein in the second contact area, the second pad line, and the second electrode part overlap each other in plan view.

4. The display device of claim 1, wherein the first pad line and the second pad line are respectively in different layers.

5. The display device of claim 1, further comprising a buffer layer on the base layer, and defining an opening exposing the first pad line in the first contact area,
    wherein the second pad line is electrically connected to the first pad line through the opening in the first contact area.

6. The display device of claim 1, further comprising an insulating layer on the second pad line, and defining an opening exposing the second pad line in the second contact area,
    wherein the second electrode part is electrically connected to the second pad line through the opening in the second contact area.

7. The display device of claim 1, wherein the first electrode part entirely covers the first contact area in plan view.

8. The display device of claim 1, wherein the pads are arranged in a matrix form with respect to a row direction and a column direction,
    wherein the row direction corresponds to a first direction,
    wherein the column direction corresponds to a second direction, and
    wherein one of the pad lines extends in the second direction, and electrically connects a subset of the pads, which are adjacent to each other in the second direction.

9. The display device of claim 8, wherein the pads are electrically connected to the pixel,
    wherein the display device further comprises a driving circuit member including a chip on film and a flexible circuit member,
    wherein an end of the chip on film is electrically connected to the pad area,
    wherein another end of the chip on film is electrically connected to the flexible circuit member, and
    wherein at least a portion of the chip on film is electrically connected to the second electrode part.

10. The display device of claim 9, wherein the chip on film includes a first chip on film and a second chip on film,
    wherein the pads include first row pads on a first row and second row pads on a second row,
    wherein the first chip on film is electrically connected to the first row pads, and wherein the second chip on film is electrically connected to the second row pads.

11. The display device of claim 10, wherein the first row pads and the second row pads are separated from each other at a separation distance that is about 500 μm or less.

12. The display device of claim 10, wherein the first contact area of the first row pads and the first contact area of the second row pads are adjacent to each other with an area interposed therebetween, and wherein the area is disposed between the first row pads and the second row pads.

13. The display device of claim 1, wherein the first electrode part and the second electrode part do not overlap each other in plan view.

14. The display device of claim 1, wherein the first electrode part and the second electrode part overlap each other in a plan view.

15. The display device of claim 1, wherein the first electrode part and the second electrode part are patterned in different respective processes.

16. The display device of claim 1, comprising:

a pixel circuit layer on the base layer, the pixel circuit layer including a lower auxiliary electrode and a transistor; and a display element layer on the pixel circuit layer, the display element layer including:

the light-emitting element;

a first contact electrode electrically connected to an end of the light-emitting element;

a second contact electrode electrically connected to another end of the light-emitting element; and an insulating layer between the first contact electrode and the second contact electrode, wherein the transistor includes an active layer, a gate electrode, a first transistor electrode electrically connected to a first contact region of the active layer, and a second transistor electrode electrically connected to a second contact region of the active layer, and wherein the first pad line includes a same material as the lower auxiliary electrode, wherein the second pad line includes a same material as the first transistor electrode and the second transistor electrode, and wherein the pad insulating pattern includes a same material as the insulating layer.

17. The display device of claim 1, wherein the light-emitting element is an organic light-emitting diode or a subminiature light-emitting element including an inorganic material.

18. The display device of claim 1, further comprising a color conversion layer on the light-emitting element, the color conversion layer including a quantum dot that changes a wavelength of light.

19. The display device of claim 1, wherein the pad area is adjacent to a side of the display area and does not overlap the display area.

* * * * *